United States Patent
Takeyama et al.

(10) Patent No.: US 8,344,048 B2
(45) Date of Patent: Jan. 1, 2013

(54) EPOXY RESIN-FORMING LIQUID PREPARATION CONTAINING INORGANIC PARTICLE

(75) Inventors: Toshiaki Takeyama, Funabashi (JP); Naohiko Suemura, Sodegaura (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 12/452,388

(22) PCT Filed: Jul. 11, 2008

(86) PCT No.: PCT/JP2008/062604
§ 371 (c)(1),
(2), (4) Date: Dec. 29, 2009

(87) PCT Pub. No.: WO2009/008509
PCT Pub. Date: Jan. 15, 2009

(65) Prior Publication Data
US 2010/0137475 A1    Jun. 3, 2010

(30) Foreign Application Priority Data
Jul. 11, 2007   (JP) ................................. 2007-182146

(51) Int. Cl.
*C08L 63/00* (2006.01)
*C08L 63/06* (2006.01)

(52) U.S. Cl. ......... 523/440; 523/400; 524/599; 524/606

(58) Field of Classification Search ........................ None
See application file for complete search history.

(56) References Cited

U.S. PATENT DOCUMENTS

| | | | |
|---|---|---|---|
| 3,496,122 A * | 2/1970 | Porret et al. ................. | 528/297 |
| 3,523,919 A * | 8/1970 | Weinrich ................... | 528/111.3 |
| 3,528,934 A * | 9/1970 | Weinrich ................... | 528/363 |
| 3,597,411 A * | 8/1971 | Weinrich et al. ............. | 528/363 |
| 3,799,900 A * | 3/1974 | Weinrich ................... | 528/363 |
| 4,988,395 A * | 1/1991 | Taguchi et al. ................ | 148/24 |
| 5,623,031 A * | 4/1997 | Imura et al. .................. | 525/489 |
| 6,177,541 B1 * | 1/2001 | Ikeda et al. .................. | 528/487 |
| 2005/0049334 A1 * | 3/2005 | Rubinsztain et al. ......... | 523/456 |
| 2005/0082691 A1 * | 4/2005 | Ito et al. ...................... | 257/788 |
| 2005/0129956 A1 | 6/2005 | Rubinsztajn et al. | |
| 2006/0105483 A1 * | 5/2006 | Leatherdale et al. ........... | 438/26 |
| 2007/0249760 A1 * | 10/2007 | Gunji et al. .................. | 523/456 |

FOREIGN PATENT DOCUMENTS

| | | |
|---|---|---|
| EP | 1 795 558 A1 | 6/2007 |
| JP | A 62-115022 | 5/1987 |
| JP | A-04-081420 | 3/1992 |
| JP | A 4-154861 | 5/1992 |
| JP | A 5-086168 | 4/1993 |
| JP | A 07-097434 | 4/1995 |
| JP | A 11-071503 | 3/1999 |
| JP | A 2002-234891 | 8/2002 |
| JP | A 2005-020664 | 1/2005 |
| JP | A 2007-504334 | 3/2007 |
| JP | A 2007-515524 | 6/2007 |
| JP | A 2007-516331 | 6/2007 |
| WO | WO 2006/035641 A1 | 4/2006 |

OTHER PUBLICATIONS

Technical date bulletin for Aerosil by Degussa, Mar. 2003, 21 pages.*
International Search Report issued in corresponding International Application No. PCT/JP2008/062604, mailed Oct. 21, 2008) (with English-language translation).
Jun. 27, 2012 Supplementary Search Report issued in European Patent Application No. 08791085.7.

* cited by examiner

*Primary Examiner* — Robert S Loewe
(74) *Attorney, Agent, or Firm* — Oliff & Berridge, PLC

(57) ABSTRACT

There is provided a liquid preparation for forming an epoxy resin having curing properties combining high transparency and high bending strength while maintaining advantageous handling properties as in a liquid state. A liquid preparation for forming an epoxy resin comprising: an A agent; and a B agent; wherein the A agent contains a modified epoxy resin (I) formed from at least one type of compound (i) having in a molecule thereof, at least one functional group of Formula (1):

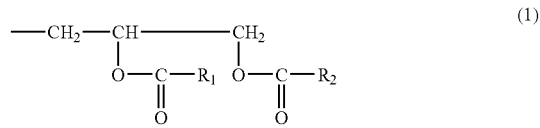

(where $R_1$ and $R_2$ individually represent an alkyl group, an alkenyl group, an alkynyl group, an aryl group, an aralkyl group, a heterocyclic group or a halogenated, aminated or nitrated derivative of any of the groups) and a compound (ii) having a glycidyl group in a molecule thereof, and an inorganic particle (II); and the B agent contains a curing agent (III). A liquid preparation for forming an epoxy resin comprising: an A' agent; and a B' agent; wherein the A' agent contains the modified epoxy resin (I); and the B' agent contains the inorganic particle (II) and the curing agent (III).

15 Claims, No Drawings

EPOXY RESIN-FORMING LIQUID PREPARATION CONTAINING INORGANIC PARTICLE

TECHNICAL FIELD

The present invention relates to a modified liquid epoxy resin characterized by extending the application range of an epoxy resin by liquefying the epoxy resin without largely impairing curing properties of the epoxy resin which is intrinsically crystalline to facilitate the handling thereof.

BACKGROUND ART

Generally, a crystalline epoxy resin has a backbone skeleton which is rigid and multi-functional and accordingly, has high heat resistance, so that a crystalline epoxy resin is used in a field requiring the reliability for heat resistance such as the electric and electronic fields.

However, depending on the application such as casting-molding, in some fields, only a liquid composition can be molded, and the use of an epoxy resin which is crystalline is limited to the applications using solid materials such as an application of transfer-molding, so that the application range of a crystalline epoxy resin is limited.

In addition, in the related art, an epoxy resin used in a liquid molding such as casting molding is a liquid epoxy resin, and cannot fully satisfy the requirement of enhancing curing properties such as heat resistance that have been more severely required nowadays in fields such as adhering, casting, sealing, molding and laminating. Thus, there has been a growing requirement for liquefying a crystalline multi-functional epoxy resin imparting curing properties including high heat resistance. On the other hand, there has also been a growing requirement for the stability of a cured product which is cured in a short wavelength range such as a white LED and a blue LED.

For example, there is disclosed an epoxy resin produced by lowering the crystallinity of an epoxy compound having high crystallinity such as tris(2,3-epoxypropyl) isocyanurate through esterifying a part of the epoxy groups of the epoxy compound to liquefy the epoxy compound (see Patent Document 1).

In addition, there is disclosed a modified epoxy resin composition in which inorganic particles such as silica particles are blended with a liquid epoxy resin.

There is disclosed an epoxy resin composition containing a main agent containing an epoxy resin and an inorganic filler and a curing agent in which the inorganic filler contains aluminum hydroxide and silica (Patent Document 2).

There is disclosed a two-component epoxy resin composition containing an A reagent in which an acid anhydride containing as essential components, methyltetrahydrophthalic acid anhydride and methylhexahydrophthalic acid anhydride, a sphere-shaped silica having an average particle diameter of 2 μm or less and an effect accelerator are blended, and a B agent containing an epoxy resin (Patent Document 3).

There is disclosed a resin composition for sealing a semiconductor containing an epoxy resin having a viscosity measured at 80° C. of 5,000 Pa·s or less, a curing agent and silica particles (Patent Document 4).

[Patent Document 1]
International Publication Pamphlet No. WO 2006/035641
[Patent Document 2]
Japanese Patent Application Publication No. JP-A-05-86168
[Patent Document 3]
Japanese Patent Application Publication No. JP-A-11-71503
[Patent Document 4]
Japanese Patent Application Publication No. JP-A-2005-206664

DISCLOSURE OF THE INVENTION

Problems to be Solved by the Invention

Nowadays, particularly in the electric and electronic fields, characteristics required for epoxy resin cured products have become more severe due to higher integration of a circuit or the use of lead-free soldering. Therefore, the related-art liquid epoxy resin becomes difficult to satisfy the above characteristics.

A liquid epoxy resin is used in potting, coating, casting or the like by virtue of such characteristics as having advantageous handling properties and causing few problems in the production thereof, such as the increase of the viscosity due to crystallization.

There has been a growing requirement for extending the application range of a crystalline epoxy resin by liquefying the crystalline epoxy resin such as a multi-functional epoxy resin providing a cured product having excellent physical properties such as high heat resistance.

In order to solve the problems described above, it is an object of the present invention to provide a liquid preparation for forming an epoxy resin having curing properties combining high transparency and high bending strength while maintaining advantageous handling properties as in a liquid state for being used in a transparent sealing material for optical semiconductors such as an LED (light emitting device).

Means for Solving the Problems

The present invention is, according to a first aspect, a liquid preparation for forming an epoxy resin containing an A agent and a B agent in which
the A agent contains a modified epoxy resin (I) formed from at least one type of compound (i) having in a molecule thereof, at least one functional group represented by Formula (1):

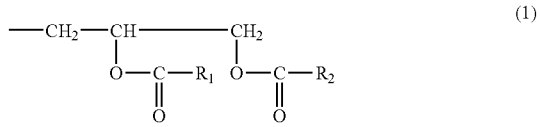

(where $R_1$ and $R_2$ individually represent an alkyl group, an alkenyl group, an alkynyl group, an aryl group, an aralkyl group, a heterocyclic group or a halogenated, aminated or nitrated derivative of any of the groups)
and a compound (ii) having a glycidyl group in the molecule of the compound, and an inorganic particle (II); and
the B agent contains a curing agent (III);
according to a second aspect, a liquid preparation for forming an epoxy resin containing an A' agent and a B' agent in which the A' agent contains the modified epoxy resin (I) as described in the first aspect and the B' agent contains the inorganic particle (II) as described in the first aspect and the curing agent (III) as described in the first aspect;
according to a third aspect, a liquid preparation for forming an epoxy resin containing the A agent as described in the first aspect and the B' agent as described in the second aspect;

according to a fourth aspect, the liquid preparation for forming an epoxy resin according to the first aspect, in which the B agent is also in a liquid state;

according to a fifth aspect, the liquid preparation for forming an epoxy resin according to the second aspect, in which the B' agent is also in a liquid state;

according to a sixth aspect, the liquid preparation for forming an epoxy resin according to the third aspect, in which the B' agent is also in a liquid state;

according to a seventh aspect, the liquid preparation for forming an epoxy resin according to any one of the first aspect to the sixth aspect, in which the compound (i) is a compound in which 1 to n glycidyl group(s) (here, n represents an integer of 2 to 16) among n glycidyl groups in the molecule of the compound is(are) replaced by a functional group represented by Formula (1);

according to an eighth aspect, the liquid preparation for forming an epoxy resin according to any one of the first aspect to the seventh aspect, in which the compound (ii) is a compound having n glycidyl groups (here, n represents an integer of 2 to 16) in the molecule of the compound;

according to a ninth aspect, the liquid preparation for forming an epoxy resin according to any one of the first aspect to the eighth aspect, in which the molar ratio of the compound (i):the compound (ii) is 1:0.3 to 1.5;

according to a tenth aspect, the liquid preparation for forming an epoxy resin according to any one of the first aspect to the ninth aspect, in which the compound (i) is a compound in which a glycidyl group of tris(2,3-epoxypropyl)-isocyanurate is replaced by a functional group represented by Formula (1);

according to an eleventh aspect, the liquid preparation for forming an epoxy resin according to any one of the first aspect to the tenth aspect, in which the compound (ii) is tris(2,3-epoxypropyl)-isocyanurate;

according to a twelfth aspect, the liquid preparation for forming an epoxy resin according to any one of the first aspect to the eleventh aspect, in which the inorganic particle is colloidal silica having a particle diameter of 5 to 100 nm;

according to a thirteenth aspect, the liquid preparation for forming an epoxy resin according to the twelfth aspect, in which the particle surface of the colloidal silica is coated with an organosilane through a reaction with an organoalkoxysilane;

according to a fourteenth aspect, the liquid preparation for forming an epoxy resin according to any one of the first aspect to the thirteenth aspect, in which the curing agent is an acid anhydride;

according to a fifteenth aspect, a liquid epoxy resin composition containing an A agent and a B agent in which the A agent contains a modified epoxy resin (I) containing a compound (i) having in a molecule thereof, a functional group represented by Formula (1):

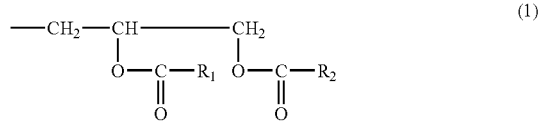

(1)

(where $R_1$ and $R_2$ individually represent an alkyl group, an alkenyl group, an alkynyl group, an aryl group, an aralkyl group, a heterocyclic group or a halogenated, aminated or nitrated derivative of any of the groups) and a compound (ii) having a glycidyl group in the molecule of the compound, and an inorganic particle (II), and the B agent contains a curing agent (III);

according to a sixteenth aspect, a liquid epoxy resin composition containing an A' agent and a B' agent in which the A' agent contains the modified epoxy resin (I) and the B' agent contains the inorganic particle (II) and the curing agent (III);

according to a seventeenth aspect, a liquid epoxy resin composition containing the A agent and the B' agent;

according to an eighteenth aspect, the liquid epoxy resin composition according to the fifteenth aspect, in which at least any one of the A agent and the B agent is in a liquid state;

according to a nineteenth aspect, the liquid epoxy resin composition according to the sixteenth aspect, in which at least any one of the A' agent and the B' agent is in a liquid state;

according to a twentieth aspect, the liquid epoxy resin composition according to the seventeenth aspect, in which at least any one of the A agent and the B' agent is in a liquid state;

according to a twenty-first aspect, the liquid epoxy resin composition according to any one of the fifteenth aspect to the twentieth aspect, in which the compound (i) is a compound in which 1 or more and n or less glycidyl group(s) (here, n represents an integer of 2 to 16) among n glycidyl groups in the molecule of the compound is(are) replaced by a functional group represented by Formula (1);

according to a twenty-second aspect, the liquid epoxy resin composition according to any one of the fifteenth aspect to the twenty-first aspect, in which the compound (ii) is a compound having n glycidyl groups (here, n represents an integer of 2 to 16) in the molecule of the compound;

according to a twenty-third aspect, the liquid epoxy resin composition according to any one of the fifteenth aspect to the twenty-second aspect, in which the molar ratio of the compound (i):the compound (ii) is 1:0.3 to 1.5;

according to a twenty-fourth aspect, the liquid epoxy resin composition according to any one of the fifteenth aspect to the twenty-third aspect, in which the compound (i) is a compound in which a glycidyl group of tris(2,3-epoxypropyl)-isocyanurate is replaced by a functional group represented by Formula (1);

according to a twenty-fifth aspect, the liquid epoxy resin composition according to any one of the fifteenth aspect to the twenty-fourth aspect, in which the compound (ii) is tris(2,3-epoxypropyl)-isocyanurate;

according to a twenty-sixth aspect, the liquid epoxy resin composition according to any one of the fifteenth aspect to the twenty-fifth aspect, in which the inorganic particle is a colloidal silica having a particle diameter of 5 to 100 nm;

according to a twenty-seventh aspect, the liquid epoxy resin composition according to the twenty-sixth aspect, in which the particle surface of the colloidal silica is coated with an organosilane through a reaction with an organoalkoxysilane; and according to a twenty-eighth aspect, the liquid epoxy resin composition according to any one of the fifteenth aspect to the twenty-seventh aspect, in which the curing agent is an acid anhydride.

Effects of the Invention

The present invention is a liquid preparation for forming an epoxy resin in which inorganic particles such as silica particles are blended. The liquid preparation for forming an epoxy resin of the present invention has advantageous handling properties as in a liquid state and curing properties combining high transparency and high bending strength.

In addition, the liquid preparation for forming an epoxy resin of the present invention also has high insulating properties.

The liquid preparation for forming an epoxy resin of the present invention contains an A agent and a B agent (or an A' agent and a B' agent, an A agent and a B' agent) and the A agent (or the A' agent) is in a liquid state. Preferably, the B agent (or the B' agent) is also in a liquid state. When an agent is in a liquid state, the agent can maintain the liquid state without adding a solvent. When a preparation for forming an epoxy resin is in a liquid state, a solvent is evaporated during the curing and the density lowering of a cured product and the formation of fine pores due to the evaporation of a solvent can be suppressed. Accordingly, curing properties of the cured product to be obtained such as bending strength are not impaired.

Thus, for maintaining the liquid state of the B agent (or the B' agent), a liquid curing agent is preferably used.

A liquid A agent (or a liquid A' agent) and a solution in which a solid B agent (or a solid B' agent) is dissolved in a solvent may be used, however, by limiting the amount used of the solvent to the minimum, desired physical properties can be obtained.

In addition, even when both agents are in a liquid state, for enhancing handling properties, a small amount of a solvent may be contained.

The inorganic particles such as silica particles are necessary to be contained in at least any one of the A agent and the B agent (or the A' agent and the B' agent), or may be contained in both agents.

BEST MODES FOR CARRYING OUT THE INVENTION

In the liquid preparation for forming an epoxy resin of the present invention, the A agent and the B agent (or the A' agent and the B' agent) are blended. The A agent is a main agent and the B agent is a curing agent. The A agent and the B agent (or the A' agent and the B' agent) are mixed prior to being used. When a mixture of the A agent and the B agent (or the A' agent and the B' agent) has a usable time which is assumed as a time lapse from a time of mixing the agents until a time when the viscosity of the mixture becomes twice, the usable time is around 48 hours.

In addition, the inorganic particles such as silica particles may be contained in both of the main agent and the curing agent. In other words, the liquid preparation for forming an epoxy resin can contain the A agent and the B' agent.

A liquid preparation for forming an epoxy resin in which the A agent and the B agent (or the A' agent and the B' agent) are mixed contains a modified epoxy resin (I), inorganic particles (II) and a curing agent (III).

In other words, the liquid preparation for forming an epoxy resin is a liquid preparation which contains the A agent containing the modified epoxy resin (I) and the inorganic particles (II), and the B agent containing the curing agent (III).

In addition, the liquid preparation for forming an epoxy resin is also a liquid preparation which contains the A' agent containing the modified epoxy resin (I), and the B agent containing the inorganic particles (II) and the curing agent (III).

Then, the liquid preparation for forming an epoxy resin may contain as optional components, a curing accelerator (IV), an anti-oxidant, a light stabilizer, a flame retardant, a flexibilizer, a coupling agent, an antifoamer, a reactive diluent, a solvent, a surfactant, a leveling agent and the like.

Among the A agent and the B agent (or the A' agent and the B' agent, the A agent and the B' agent), the A agent (or the A' agent) is in a liquid state, however, it is more preferred that the B agent (or the B' agent) is also in a liquid state. The "in a liquid state" means being in a liquid state (is also referred to as "liquid") at normal temperature (for example, 20° C.) under normal pressure (under atmospheric pressure).

The liquid preparation for forming an epoxy resin contains 5 to 900 parts by mass, preferably 50 to 400 pats by mass, of the inorganic particles (II), based on 100 parts by mass of the modified epoxy resin (I).

Then, the curing agent (III) is contained in parts by mass corresponding to 0.5 to 1.5 equivalents, preferably 0.8 to 1.2 equivalents relative to the epoxy equivalent calculated from an epoxy value of the modified epoxy resin (I). Accordingly, it is preferred that according to this ratio, the A agent and the B agent (or the A' agent and the B' agent, the A agent and the B' agent) are blended.

The modified epoxy resin (I) used in the present invention is formed from at least one type of a compound (i) having at least one functional group represented by Formula (1) in the molecule of the compound, and a compound (ii) having a glycidyl group in the molecule of the compound. The modified epoxy resin (I) becomes liquid by containing the compound (i) and the compound (ii).

The compound (i) is a compound in which n glycidyl groups (here, n represents an integer of 2 to 16) in the molecule of the compound are replaced by 1 to n functional group(s) represented by Formula (1).

In addition, the compound (ii) is a compound having n glycidyl groups (here, n represents an integer of 2 to 16) in the molecule of the compound.

An epoxy compound as a raw material for the above compound (i) is also an epoxy compound of the compound (ii), and is an epoxy resin produced from various phenols such as bisphenol A, bisphenol F, bisphenol AD, resorcin, methylresorcin, dihydroxynaphthalene, phenol novolac resins, cresol novolac resins, bisphenol A novolac resins, dicyclopentadiene phenol resins, terpene phenol resins, phenol aralkyl resins and naphthol novolac resins; various phenol-based compounds such as polyphenol resins obtained by a condensation reaction of the above various phenols with various aldehydes such as hydroxybenzaldehyde, crotonaldehyde and glyoxal; and epihalohydrin.

In addition, other examples of the epoxy resin include epoxy resins produced from various amine compounds such as diaminodiphenylmethane, aminophenol and xylenediamine and epihalohydrin, and further other examples of the epoxy resin include epoxy resins produced from various carboxylic acids such as methylhexahydroxyphthalic acid and dimer acid, and epihalohydrin.

In the modified epoxy resin used in the present invention, the molar ratio of the compound (i):the compound (ii) is 1:0.3 to 1.5.

The modified epoxy resin used in the present invention is obtained by reacting the compound (ii) and an acid anhydride in a molar ratio (glycidyl group of the compound (ii)):(acid anhydride) of 1:0.1 to 1.0.

In the present invention, an epoxy compound serving as a raw material for the compound (i) and an epoxy compound of the compound (ii) in which n is 3 are preferred. Further, as the epoxy compound serving as a raw material for the compound (i) and the epoxy compound of the compound (ii), tris(2,3-epoxypropyl)-isocyanurate can be preferably used. By using tris(2,3-epoxypropyl)-isocyanurate, a cured product excellent in light resistance, weatherability, heat resistance, transparency and the like can be obtained.

In other words, the compound (i) is preferably a compound in which a glycidyl group of tris(2,3-epoxypropyl)-isocyanurate is replaced by a functional group of Formula (1). In addition, the compound (ii) is preferably tris(2,3-epoxypropyl)-isocyanurate.

In the present invention, as the compound having a glycidyl group in the molecule of the compound, tris(2,3-epoxypropyl)-isocyanurate will be described in detail.

Tris(2,3-epoxypropyl)-isocyanurate is an epoxy resin having three glycidyl groups in one molecule of the resin and having high crystallinity.

A reason for the high crystallinity of tris(2,3-epoxypropyl)-isocyanurate is considered to be because hydrogen bonds are formed between oxygen atoms of three epoxy groups existing in the molecule thereof and other molecules. By converting the oxygen atom of the epoxy group through a chemical reaction, the crystallinity of the compound can be lowered to liquefy the compound. However, for curing the epoxy resin by effecting a curing reaction between the epoxy resin and a curing agent, an epoxy group is necessary. Accordingly, the modified epoxy resin is necessary to be a mixture of a compound (i) in which epoxy groups are partially converted and a compound (ii) in which an epoxy group is not converted.

In the present invention, by blending tris(2,3-epoxypropyl)-isocyanurate in which a glycidyl group is replaced by a functional group represented by Formula (1) and tris(2,3-epoxypropyl)-isocyanurate, a liquid modified epoxy resin can be obtained.

The compound (i) is actually a mixture of a compound in which one acid anhydride represented by Formula (2) is added to a glycidyl group of tris(2,3-epoxypropyl)-isocyanurate, a compound in which two acid anhydrides are added thereto and a compound in which three anhydrides are added thereto.

The modified epoxy resin of the present invention is preferably obtained by reacting tris(2,3-epoxypropyl)-isocyanurate with an acid anhydride in a molar ratio (glycidyl group of tris(2,3-epoxypropyl)-isocyanurate):(acid anhydride) of 1:0.1 to 0.5.

Then, it is preferred that obtained is a modified epoxy resin containing a mixture (compound (i)) of a compound in which one acid anhydride represented by Formula (2) is added to a glycidyl group of tris(2,3-epoxypropyl)-isocyanurate, a compound in which two acid anhydrides are added thereto and a compound in which three anhydrides are added thereto, and tris(2,3-epoxypropyl)-isocyanurate (compound (ii)) in a molar ratio (compound (i)):(compound (ii)) of 1:0.3 to 1.5.

In the present invention, the acid anhydride (Formula (2)) used in the production of the compound (i) is a so-called "acid anhydride obtained from two molecules of monocarboxylic acid" and is different from an acid anhydride obtained from a dicarboxylic acid which is used as a curing agent for an epoxy resin in terms of having no function as a curing agent for an epoxy resin.

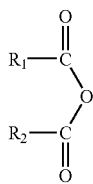

(2)

The total number of glycidyl groups of the synthesized compound (i) and glycidyl groups of the compound (ii) is preferably 2 or more as converted into an average number per molecule (calculated by dividing the total number of glycidyl groups with the total number of molecules). When the total number is less than 2, physical properties of the cured product, particularly heat resistance is impaired, which is not preferred.

The acid anhydride (Formula (2)) used in the present invention is not particularly limited, however, is an acid anhydride in which $R_1$ and $R_2$ independently represent an alkyl group, an alkenyl group, an alkynyl group, an aryl group, an aralkyl group, a heterocyclic group or halogenated, aminated or nitrated derivatives thereof.

The alkyl group is an alkyl group having 1 to 18 carbon atom(s) and examples thereof include a methyl, an ethyl, an n-propyl, an isopropyl, a cyclopropyl, an n-butyl, an isobutyl, a sec-butyl, a tert-butyl, a cyclobutyl, a 1-methyl-cyclopropyl, a 2-methyl-cyclopropyl, an n-pentyl, a 1-methyl-n-butyl, a 2-methyl-n-butyl, a 3-methyl-n-butyl, a 1,1-dimethyl-n-propyl, an 1,2-dimethyl-n-propyl, a 2,2-dimethyl-n-propyl, a 1-ethyl-n-propyl, a cyclopentyl, a 1-methyl-cyclobutyl, a 2-methyl-cyclobutyl, a 3-methyl-cyclobutyl, an 1,2-dimethyl-cyclopropyl, a 2,3-dimethyl-cyclopropyl, a 1-ethyl-cyclopropyl, a 2-ethyl-cyclopropyl, an n-hexyl, a 1-methyl-n-pentyl, a 2-methyl-n-pentyl, a 3-methyl-n-pentyl, a 4-methyl-n-pentyl, a 1,1-dimethyl-n-butyl, a 1,2-dimethyl-n-butyl, a 1,3-dimethyl-n-butyl, a 2,2-dimethyl-n-butyl, a 2,3-dimethyl-n-butyl, a 3,3-dimethyl-n-butyl, a 1-ethyl-n-butyl, a 2-ethyl-n-butyl, a 1,1,2-trimethyl-n-propyl, a 1,2,2-trimethyl-n-propyl, a 1-ethyl-1-methyl-n-propyl, a 1-ethyl-2-methyl-n-propyl, a cyclohexyl, a 1-methyl-cyclopentyl, a 2-methyl-cyclopentyl, a 3-methyl-cyclopentyl, a 1-ethyl-cyclobutyl, a 2-ethyl-cyclobutyl, a 3-ethyl-cyclobutyl, a 1,2-dimethyl-cyclobutyl, a 1,3-dimethyl-cyclobutyl, a 2,2-dimethyl-cyclobutyl, a 2,3-dimethyl-cyclobutyl, a 2,4-dimethyl-cyclobutyl, a 3,3-dimethyl-cyclobutyl, a 1-n-propyl-cyclopropyl, a 2-n-propyl-cyclopropyl, a 1-isopropyl-cyclopropyl, a 2-isopropyl-cyclopropyl, a 1,2,2-trimethyl-cyclopropyl, a 1,2,3-trimethyl-cyclopropyl, a 2,2,3-trimethyl-cyclopropyl, a 1-ethyl-2-methyl-cyclopropyl, a 2-ethyl-1-methyl-cyclopropyl, a 2-ethyl-2-methyl-cyclopropyl, a 2-ethyl-3-methyl-cyclopropyl, an n-heptyl and a cyclohexyl.

The alkenyl group is an alkenyl group having 2 to 6 carbon atoms and examples thereof include a vinyl group, a 1-propenyl group and a 2-propenyl group.

The alkynyl group is an alkynyl group having 2 to 6 carbon atoms and examples thereof include an ethynyl group and a propargyl group.

The aryl group is an aryl group having 6 to 20 carbon atoms and examples thereof include a phenyl group, a tolyl group, a naphthyl group, a methylnaphthyl group, an anthryl group and an ethylanthryl group.

The aralkyl group is an aralkyl group having 7 to 22 carbon atoms and examples thereof include a benzyl group, a phenethyl group, a naphthylmethyl group, a naphthylethyl group, an anthryl group and an anthrylmethyl group.

Examples of the heterocyclic group include an imidazole group, a pyrazole group, a pyridazine group, a pyrimidine group, a quinoline group, a benzoxazole group, a thiophene group, a dithiol group, a thiazole group, a thiadiazole group and a benzothiazole group.

These alkyl groups, alkenyl groups, alkynyl groups, aryl groups, aralkyl groups and heterocycle groups can be used also as halogenated (fluorinated, chlorinated, brominated, iodinated), aminated or nitrated derivative groups.

Examples of such derivative groups include a chloromethyl group, a dichloromethyl group, a trichloromethyl group, a trifluoromethyl group, an aminophenyl group and a nitrobenzyl group.

$R_1$ and $R_2$ may be the same as or different from each other. Examples of the acid anhydride of Formula (2) containing $R_1$ and $R_2$ include acetic anhydride, propionic anhydride, n-butyric anhydride, n-valeric anhydride, n-hexanoic anhydride, trifluoroacetic anhydride, cinnamic anhydride and benzoic anhydride. $R_1$ and $R_2$ in Formula (1) are defined depending on the type of the acid anhydride (Formula (2)) to be used, however, $R_1$ and $R_2$ are preferably a straight chain hydrocarbon group having 1 to 5 carbon atom(s) in terms of transparency of the cured product obtained. The acid anhydride is particularly preferably propionic anhydride.

When tris(2,3-epoxypropyl)-isocyanurate is used as an epoxy resin having high crystallinity, preferably used is a low melting point-type (α-type) stereoisomer of tris(2,3-epoxypropyl)-isocyanurate.

Tris(2,3-epoxypropyl)-isocyanurate synthesized from isocyanuric acid and epichlorohydrin is a mixture containing a low melting point-type stereoisomer (which is an α-type crystal and is called α-type) of tris(2,3-epoxypropyl)-isocyanurate and a high melting point-type stereoisomer (which is β-type crystal and is called β-type) of tris(2,3-epoxypropyl)-isocyanurate in a ratio of 3:1.

This is because in epichlorohydrin as a raw material, there exist an R-type optical isomer and an S-type optical isomer in an equimolar amount and in synthesized tris(2,3-epoxypropyl)-isocyanurate, three molecules of epichlorohydrin per molecule are added, so that eight types of tris(2,3-epoxypropyl)-isocyanurate such as RRR-, SSS-, RSS-, SSR-, SRS-, RRS-, RSR- and SRR-arrangements are generated each in substantially the same ratio.

Here, tris(2,3-epoxypropyl)-isocyanurate forming a crystal thereof with a combination of an RRR form and an SSS form is β-type tris(2,3-epoxypropyl)-isocyanurate, and tris(2,3-epoxypropyl)-isocyanurate forming a crystal thereof with a combination of other six forms is α-type tris(2,3-epoxypropyl)-isocyanurate, so that the crystal is generated in the above generation ratio.

α-type tris(2,3-epoxypropyl)-isocyanurate has a melting point of 98 to 107° C. (as measured by an automatic melting point measuring method Mettler at a temperature elevating rate of 2° C./min. Hereinafter, measured in the same manner) and has also extremely high solubility in a solvent in the comparison with β-type tris(2,3-epoxypropyl)-isocyanurate having a melting point of 152 to 158° C. This difference is due to the difference in the intermolecular interaction of tris(2,3-epoxypropyl)-isocyanurate molecules forming the α-type crystal and the β-type crystal, and the difference means that the β-type crystal has a crystallinity higher than that of the α-type crystal. In other words, in the case where tris(2,3-epoxypropyl)-isocyanurate is applied to the liquid preparation for forming an epoxy resin of the present invention, when unreacted tris(2,3-epoxypropyl)-isocyanurate is an α-type crystal, it is more difficult to be deposited, so that it is preferred that as a raw material, α-type tris(2,3-epoxypropyl)-isocyanurate is used.

Next, the reaction between tris(2,3-epoxypropyl)-isocyanurate and an acid anhydride is described.

The solvent used in the reaction may be any solvent so long as it is a solvent inactive to the reaction and representative examples of the solvent include ketones such as acetone and methyl ethyl ketone; nitriles such as acetonitrile; ethers such as tetrahydrofuran and dioxane; esters such as ethyl acetate; aromatic hydrocarbons such as chlorobenzene and toluene; and halogenated hydrocarbons such as chloroform and dichloroethane.

These solvents may be used individually or as a solvent mixture thereof and can dissolve tris(2,3-epoxypropyl)-isocyanurate.

If necessary, as a catalyst, there can be used tertiary amines such as triethylamine, tripropylamine and 1,8-diazabicyclo-5,4,0-undecane-7-ene; quaternary phosphonium salts such as halogenated triphenylmonoalkylphosphonium represented by triphenylethylphosphonium bromide; imidazole silicon compounds such as 2-ethyl-4-methylimidazole; quaternary ammonium salts such as tetraethylammonium bromide; and phosphorus compounds such as triphenyl phosphine.

The reaction is effected at a reflux temperature of the solvent until the epoxy group content measured by a titration with a 0.1 N perchloric acid/acetic acid solution reaches a theoretical value (a value at which an added acid anhydride disappears by the reaction). After the completion of the reaction, the solvent is distilled off to obtain a liquid preparation for forming an epoxy resin.

The obtained liquid modified epoxy resin (I) is found, as the result of an HPLC (high performance liquid chromatography) analysis, to be a resin containing: a mixture (compound (i)) of a compound in which one acid anhydride represented by Formula (2) is added to a glycidyl group of tris(2,3-epoxypropyl)-isocyanurate, a compound in which two acid anhydrides are added thereto and a compound in which three anhydrides are added thereto; and unreacted tris(2,3-epoxypropyl)-isocyanurate (compound (ii)).

In addition, the obtained liquid modified epoxy resin (I) is a resin containing: a mixture (compound (i)) of a compound in which one acid anhydride represented by Formula (2) is added to a glycidyl group of tris(2,3-epoxypropyl)-isocyanurate and a compound in which two acid anhydrides are added thereto; and unreacted tris(2,3-epoxypropyl)-isocyanurate (compound (ii)).

Then, the obtained liquid modified epoxy resin (I) is a resin containing: a compound (compound i) in which one acid anhydride represented by Formula (2) is added to a glycidyl group of tris(2,3-epoxypropyl)-isocyanurate; and unreacted tris(2,3-epoxypropyl)-isocyanurate (compound (ii)).

The liquid modified epoxy resin (I) has a viscosity of about 500 mPas to 5,000 mPas as measured at 60° C.

In the present invention, differing from a case where a monocarboxylic acid is added to an epoxy resin, there is no hydroxyl group generated by ring-opening of an epoxy group, so that when an epoxy resin mixed with an acid anhydride curing agent is preserved, the resultant mixture does not become gelled. In other words, when a part of epoxy groups is modified with a monocarboxylic acid, a hydroxyl group generated by ring-opening of an epoxy group accelerates the reaction at the time when an acid anhydride curing agent is used to obtain a cured product. As a result, the epoxy resin is dissolved in the acid anhydride curing agent, so that even when the mixture is preserved at room temperature, the mixture unavoidably becomes gelled.

In addition, differing from a dicarboxylic anhydride usually used as a curing agent for an epoxy resin, the acid anhydride of the modified compound used in the present invention is modified tris(2,3-epoxypropyl)-isocyanurate after the reaction with tris(2,3-epoxypropyl)-isocyanurate, so that there is no need to worry about gelation by being reacted during the preservation thereof or being reacted by heating.

An advantage of using tris(2,3-epoxypropyl)-isocyanurate as an epoxy resin having high crystallinity is to provide a cured product excellent in heat resistance as well as weatherability, light resistance and transparency. In other words, since tris(2,3-epoxypropyl)-isocyanurate has a triazine skeleton, in comparison with many epoxy resins having an aromatic ring, absorbs a small amount of UV rays and is not prone to cause an oxidative decomposition, so that the cured product is less colored by the irradiation with UV rays and consequently has high transparency.

The liquid modified epoxy resin of the present invention can be dissolved in a commercially available epoxy resin which is in a liquid state at room temperature to be used. The mixing ratio between the liquid modified epoxy resin of the present invention and a commercially available liquid epoxy resin is arbitral, however, it is preferably a ratio of 100 parts by mass or less of a commercially available liquid epoxy resin relative to 100 parts by mass of the liquid modified epoxy resin of the present invention. This is because, if the amount of the commercially available liquid epoxy resin is more than 100 parts by mass, the performance of the modified epoxy resin intrinsic to the present invention becomes impaired. The commercially available epoxy resin used here which is in a liquid state at room temperature is not particularly limited, however, examples thereof include a bisphenol A-type liquid epoxy resin, a bisphenol F-type liquid epoxy resin, a hydrogenated bisphenol A-type liquid epoxy resin and a dimer acid diglycidyl ester.

The inorganic particles (II) used in the present invention is an inorganic particle having an average particle diameter of 5 nm to 100 nm, preferably 5 nm to 50 nm, more preferably 5 nm to 40 nm, and most preferably 5 nm to 30 nm. In the present invention, the measured value of the average particle diameter is an average particle diameter value calculated from a specific surface area value measured by a nitrogen adsorption method of inorganic particles Examples of the inorganic particles include particles of silica, aluminum oxide, aluminum hydroxide, talc, calcium carbonate, mica, magnesium hydroxide, tin oxide, zirconium oxide and titanium oxide. Among these inorganic particles, preferred is a particle of silica and particularly preferred is a particle of colloidal silica having the above value of the average particle diameter.

As the colloidal silica, a silica sol may be used. As the silica sol, there can be used an aqueous silica sol produced by a publicly known method using a sodium silicate aqueous solution as a raw material and an organic solvent dispersed silica sol obtained by exchanging water as a dispersion medium of the above aqueous silica sol with an organic solvent.

In addition, there can also be used a silica sol obtained by hydrolyzing an alkoxysilane such as methyl silicate and ethyl silicate in an organic solvent such as alcohol in the presence of a catalyst (for example, an alkaline catalyst such as ammonia, organic amine compounds and sodium hydroxide) and by condensing the resultant hydrolyzed product, or an organosilica sol obtained by solvent-exchanging the above obtained silica sol with another organic solvent.

The surface of colloidal silica particles in the silica sol obtained using a sodium silicate aqueous solution as a raw material generally has an acidity due to the influence of metal components such as aluminum which is contaminated in the raw material in a trace amount and such silica particles may gradually cause curing reaction in the A solution (or A' solution) by acting as a curing catalyst of the above epoxy group. In such a case, it is preferred to neutralize the acidity on the surface of the colloidal silica particles. This neutralization is achieved by adding alkaline substances (or an aqueous solution thereof) as a neutralizing agent to the aqueous silica sol or the organic solvent dispersed silica sol.

Examples of the alkaline substances include lithium hydroxide, beryllium hydroxide, sodium hydroxide, magnesium hydroxide, potassium hydroxide, calcium hydroxide, ammonium hydroxide and organic amines.

Examples of the organic amines include alkylamines such as isopropylamine, diisopropylamine, n-propylamine and diisobutylamine; aralkylamines such as benzylamine; alicyclic amines such as piperidine; alkanolamines such as monoethanolamine and triethanolamine; quaternary ammonium such as tetramethylammonium hydroxide; cyclic amines such as imidazole, imidazole derivatives, 1,8-diaza-bicyclo(5,4,0)undecene-7 and 1,5-diaza-bicyclo(4,3,0)nonene-5,1, 4-diaza-bicyclo(2,2,2)octane; and aminosilanes such as aminopropyltrimethoxysilane and aminopropyltriethoxysilane.

The neutralization can be achieved by adding 0.001 to 0.3 molecules (this value is the number of molecules converted into that of a single base) of an alkaline substance per $nm^2$ of the particle surface of the above silica sol produced using a sodium silicate aqueous solution as a raw material. For example, the neutralization is performed by adding 0.015 to 4.5 parts by mass of a sodium hydroxide solution having a concentration of 10% by mass to 100 parts by mass of silica (solid content) in an acidic silica sol having an average particle diameter of 12 nm.

In addition, the surface of the silica particle can be coated with a silane coupling agent for enhancing the dispersibility of the particle in an organic solvent.

As the above silane coupling agent, there can be used at least one type of silicon-containing substance selected from the group consisting of an organosilicon compound represented by Formula (3):

(where $R^1$ and $R^3$ individually represent an organic group having an alkyl group, an aryl group, a halogenated alkyl group, a halogenated aryl group, an alkenyl group, an epoxy group, an acryloyl group, a methacryloyl group, a mercapto group, an amino group or a cyano group and is bonded to a silicon atom through an Si—C bond; $R^2$ represents an alkyl group having 1 to 8 carbon atom(s), an alkoxyalkyl group or an acyl group; and a and b individually represent an integer of 0, 1 or 2, and a+b represents an integer of 1, 2 or 3), an organosilicon compound represented by Formula (4):

(where $R^4$ represents an alkyl group having 1 to 5 carbon atom(s); X represents an alkyl group having 1 to 4 carbon atom(s) or an acyl group; Y represents a methylene group or an alkylene group having 2 to 20 carbon atoms; and c represents an integer of 0 or 1), and hydrolysates thereof.

The compounds represented by Formula (3) include organosilicon compounds represented by Formula (3) in which $R^1$ and $R^3$ represent the same organic group or organic groups different from each other or a and b represent the same integer or integers different from each other.

Examples of the organosilicon compound represented by Formula (3) include methyltrimethoxysilane, methyltripropoxysilane, methyltriacetoxysilane, methyltributoxysilane, methyltripropoxysilane, methyltriamyloxysilane, methyltriphenoxysilane, methyltribenzyloxysilane, methyltriphenetyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, ethyltrimethoxysilane, ethyltriethoxysilane, vinyltrimethoxysilane, vinyltriethoxysilane, vinyltriacetoxysilane, phenyltrimethoxysilane, phenyltriethoxysilane, phenyltriacetoxysilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, N-(β-aminoethyl) γ-aminopropyltrimethoxysilane, N-(β-aminoethyl) γ-aminopropylmethyldimethoxysilane, γ-aminopropylmethyldimethoxysilane, N-(β-aminoethyl) γ-aminopropyltriethoxysilane, N-(β-aminoethyl) γ-aminopropylmethyldiethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, methylvinyldiethoxysilane, phenyldimethylmonoethoxysilane and cyclohexylmethyldimethoxysilane, and these organosilicon compounds may be used individually or in combination of two or more types thereof.

Examples of the organosilicon compound represented by Formula (4) include methylenebismethyldimethoxysilane, ethylenebisethyldimethoxysilane, propylenebisethyldiethoxysilane and butylenebismethyldiethoxysilane, and these organosilicon compounds may be used individually or in combination of two or more types thereof.

As the organosilicon compound represented by Formula (3) or Formula (4), there can be also used any combination of tetramethoxysilane, tetraethoxysilane, tetra-n-propoxysilane, tetraisopropoxysilane, tetra-n-butoxysilane and tetraacetoxysilane.

The hydrolysate of the organosilicon compound represented by Formula (3) or Formula (4) is a compound in which a part or all of the above Xs is(are) replaced by a hydrogen atom by the hydrolysis of the organosilicon compound.

The hydrolysate of the organosilicon compounds may be used individually or in combination of two or more types thereof.

The above coating of the surface of silica particles by an organosilicon compound is performed by adding the above organosilicon compound into an aqueous silica sol or an organic solvent dispersed silica sol and by stirring and heating the resultant mixture.

Among the above organosilicon compounds, preferred is at least one type of silicon-containing substance selected from the group consisting of organosilicon compounds represented by General Formula (3) and hydrolysates thereof. Particularly preferred are organosilicon compounds such as phenyltrimethoxysilane.

The coverage of the silica particle by an organosilicon compound is preferably 5 to 40% relative to all silanol groups in the particle surface. This coating can be performed, for example by adding 9 to 75 mmol of the organosilicon compound relative to 100 parts by mass of the silica content (solid content) of a silica sol having an average particle diameter of 12 nm and by subjecting the resultant mixture to a thermal reaction.

The above aqueous silica sol can be used as an organosilica sol in which the medium of the aqueous silica sol is solvent-exchanged to an organic solvent. Examples of the organic solvent include lower alcohols such as methyl alcohol, ethyl alcohol and isopropyl alcohol; straight chain amides such as dimethylformamide and N,N'-dimethylacetoamide; cyclic amides such as N-methyl-2-pyrrolidone; glycols such as ethylcellosolve and ethylene glycol; and acetonitrile. The exchange can be performed by a typical method such as a distillation method and an ultrafiltration method.

The viscosity of the above organosilica sol is around 0.6 mPas to 100 mPas at 20° C.

In the present invention, examples of the aqueous silica sol used as a raw material include commercially available silica sols such as SNOWTEX (trade name) OXS (an acidic aqueous silica sol; manufactured by Nissan Chemical Industries, Ltd.), SNOWTEX (trade name) OS (an acidic aqueous silica sol; manufactured by Nissan Chemical Industries, Ltd.), SNOWTEX (trade name) O (an acidic aqueous silica sol; manufactured by Nissan Chemical Industries, Ltd.), SNOWTEX (trade name) O-40 (an acidic aqueous silica sol; manufactured by Nissan Chemical Industries, Ltd.), SNOWTEX (trade name) OL (an acidic aqueous silica sol; manufactured by Nissan Chemical Industries, Ltd.) and SNOWTEX (trade name) OUP (an acidic aqueous silica sol; manufactured by Nissan Chemical Industries, Ltd.).

In addition, in the present invention, examples of the organic solvent dispersed silica sol used as a raw material include commercially available silica sols such as: MA-ST-S (trade name; a methanol dispersed silica sol; manufactured by Nissan Chemical Industries, Ltd.); MT-ST (trade name; a methanol dispersed silica sol; manufactured by Nissan Chemical Industries, Ltd.); MA-ST-UP (trade name; a methanol dispersed silica sol; manufactured by Nissan Chemical Industries, Ltd.); MA-ST-MS (trade name; a methanol dispersed silica sol; manufactured by Nissan Chemical Industries, Ltd.); MA-ST-L (trade name; a methanol dispersed silica sol; manufactured by Nissan Chemical Industries, Ltd.); IPA-ST-S (trade name; an isopropanol dispersed silica sol; manufactured by Nissan Chemical Industries, Ltd.); IPA-ST (trade name; an isopropanol dispersed silica sol; manufactured by Nissan Chemical Industries, Ltd.); IPA-ST-UP (trade name; an isopropanol dispersed silica sol; manufactured by Nissan Chemical Industries, Ltd.); IPA-ST-MS (trade name; an isopropanol dispersed silica sol; manufactured by Nissan Chemical Industries, Ltd.); IPA-ST-L (trade name; an isopropanol dispersed silica sol; manufactured by Nissan Chemical Industries, Ltd.); IPA-ST-ZL (trade name; an isopropanol dispersed silica sol; manufactured by Nissan Chemical Industries, Ltd.); NPC-ST-30 (trade name; an n-propylcellosolve dispersed silica sol; manufactured by Nissan Chemical Industries, Ltd.); PGM-ST (trade name; a 1-methoxy-2-propanol dispersed silica sol; manufactured by Nissan Chemical Industries, Ltd.); DMAC-ST (trade name; a dimethylacetamide dispersed silica sol; manufactured by Nissan Chemical Industries, Ltd.); XBA-ST (trade name; a solvent mixture of xylene and n-butanol dispersed silica sol; manufactured by Nissan Chemical Industries, Ltd.); EAC-ST (trade name; an ethyl acetate dispersed silica sol; manufactured by Nissan Chemical Industries, Ltd.); PMA-ST (trade name; a propylene glycol monomethyl ether acetate dispersed silica sol; manufactured by Nissan Chemical Industries, Ltd.); MEK-ST (trade name; a methyl ethyl ketone dispersed silica sol; manufactured by Nissan Chemical Industries, Ltd.); MEK-ST-UP (trade name; a methyl ethyl ketone dispersed silica sol; manufactured by Nissan Chemical Industries, Ltd.); MEK-ST-MS (trade name; a methyl ethyl ketone dispersed silica sol; manufactured by Nissan Chemical Industries, Ltd.); MEK-ST-L (trade name; a methyl ethyl ketone dispersed silica sol; manufactured by Nissan Chemical Industries, Ltd.); and MIBK-ST (trade name; a methyl isobutyl ketone dispersed silica sol; manufactured by Nissan Chemical Industries, Ltd.).

In the present invention, as the dispersion medium of a silica sol used by mixing with an epoxy monomer (modified epoxy resin (I)) or a curing agent, the above organic solvents may be used individually or in combination of two or more types thereof. In addition, it is preferred that the dispersion medium has advantageous compatibility with the epoxy monomer or the curing agent used in the present invention, low reactivity with the epoxy monomer or the curing agent, and a boiling point lower than that of the epoxy monomer or the curing agent.

When the dispersion medium has poor compatibility with the epoxy monomer or the curing agent, at the time when the epoxy monomer or the curing agent is added to a silica sol, a two layer separation between a silica sol layer and an epoxy monomer or curing agent layer occurs, and during the desolvation, colloidal silica particles are not transferred into the epoxy monomer or the curing agent. Therefore, a desired colloidal silica-containing epoxy monomer or curing agent may not be obtained.

When the dispersion medium has high reactivity with the epoxy monomer or the curing agent, the stability of the colloidal silica-containing epoxy monomer or curing agent may become impaired or in a cured product obtained using the colloidal silica-containing epoxy monomer or the curing agent, a curing failure may occur. Particularly, an acid anhydride-based curing agent has high reactivity with a water content and alcohol. Therefore, physical properties of the final cured product may be impaired through the ring-opening, so that it is not preferred that the dispersion medium of the silica sol contains water and alcohol.

When the dispersion medium has a boiling point higher than that of the epoxy monomer or the curing agent, the evaporation of the epoxy monomer or the curing agent is preferentially caused during the desolvation, so that a large amount of the epoxy monomer or the curing agent becomes necessary for obtaining a desired colloidal silica-containing epoxy monomer or curing agent, which is not preferred.

As the curing agent (III) used in the present invention, a curing agent used for an epoxy resin can be used. Examples of the curing agent include phenol resins, amines, polyamide resins, imidazoles, polymercaptans and acid anhydrides. Even if these curing agents are solids, the agents can be used by being dissolved in a solvent. However, in the obtained cured product, a density lowering due to the evaporation of a solvent, a strength lowering due to the formation of fine pores and a lowering of water resistance are caused, so that it is preferred that the curing agent itself is in a liquid state at normal temperature and under normal pressure.

Examples of the phenol resins include phenol novolac resins and cresol novolac resins.

Examples of the amines include piperidine, N,N-dimethylpiperazine, triethylenediamine, 2,4,6-tris(dimethylaminomethyl)phenol, benzyldimethylamine, 2-(dimethylaminomethyl)phenol, diethylenetriamine, triethylenetetramine, tetraethylenepentamine, diethylaminopropylamine, N-aminoethylpiperazine, di(1-methyl-2-aminocyclohexyl)methane, mencene diamine, isophorone diamine, diaminodicyclohexylmethane, 1,3-diaminomethylcyclohexane, xylene diamine, methaphenylene diamine, diaminodiphenylmethane and diaminodiphenylsulfone. Among them, there can be preferably used diethylenetriamine, triethylenetetramine, tetraethylenepentamine, diethylaminopropylamine, N-aminoethylpiperazine, di(1-methyl-2-aminocyclohexyl)methane, mencene diamine, isophorone diamine and diaminodicyclohexylmethane, all of which are in a liquid state.

Examples of the polyamide resins include polyamide amines having in the molecules thereof primary amines and secondary amines, which are produced by a condensation of dimer acids and polyamines.

Examples of the imidazoles include 2-methylimidazole, 2-ethyl-4-methylimidazole, 1-cyanoethyl-2-undecylimidazolium trimellitate and epoxy imidazole-adduct.

Preferred examples of the polymercaptans include a polymercaptan in which a mercaptan group exists at a terminal of a polypropylene glycol chain and a polymercaptan in which a mercaptan group exists at a terminal of a polyethylene glycol chain, both of which are in a liquid state.

In the present invention, as the curing agent (III), an acid anhydride is preferably used. As the acid anhydride, preferred are anhydrides of compounds having in one molecule thereof, a plurality of carboxyl groups.

Examples of such an acid anhydride include phthalic anhydride, trimellitic anhydride, pyromellitic dianhydride, benzophenonetetracarboxylic anhydride, ethylene glycol bis-trimellitate, glycerol tris-trimellitate, maleic anhydride, tetrahydrophthalic anhydride, methyltetrahydrophthalic anhydride, endo methylenetetrahydrophthalic anhydride, methyl endo methylenetetrahydrophthalic anhydride, methylbutenyltetrahydrophthalic anhydride, dodecenylsuccinic anhydride, hexahydrophthalic anhydride, methylhexahydrophthalic anhydride, succinic anhydride, methylcyclohexenedicarboxylic anhydride and chlorendic anhydride.

Among them, preferred are methyltetrahydrophthalic anhydride, methyl-5-norbornene-2,3-dicarboxylic anhydride (methylnadic anhydride, methylhimic anhydride), hydrogenated methylnadic anhydride, methylbutenyltetrahydrophthalic anhydride, dodecenylsuccinic anhydride and methylhexahydrophthalic anhydride, all of which are in a liquid state at normal temperature under normal pressure. These liquid acid anhydrides have a viscosity of around 10 mPas to 1,000 mPas as measured at 25° C.

In addition, in obtaining the above cured product, a curing accelerator may be accordingly used in combination. Examples of the curing accelerator include organophosphorus compounds such as triphenylphosphine and tributylphosphine; quaternary phosphonium salts such as ethyltriphenylphosphonium bromide and diethyl methyltriphenylphosphoniumphosphate; 1,8-diazabicyclo(5,4,0)undecane-7-ene; salts of 1,8-diazabicyclo(5,4,0)undecane-7-ene with octylic acid; zinc octoate; and quaternary ammonium salts such as tetrabutylammonium bromide. These curing accelerators may be contained in an amount of 0.001 to 0.1 parts by mass relative to 1 part by mass of the curing agent and may be contained in any of the A agent, the B agent, the A' agent and the B' agent.

In the present invention, the A agent contains a modified epoxy resin (I) and an inorganic particle (II) and can be obtained, for example, by a method of mixing a liquid modified epoxy resin (I) and an organosilica sol (II). The mixing for producing the A agent is performed using a mixer and the desolvation is performed using an apparatus such as a rotary evaporator. The viscosity of the A agent during the mixing is about 1,000 mPas to 4,000 mPas as measured at 60° C., and the viscosity thereof after the preservation at 20° C. for 90 days is 1,000 mPas to 5,000 mPas as measured at 60° C.

Since the B agent is the curing agent (III), a liquid acid anhydride may be used.

As the A' agent, a liquid modified epoxy resin (I) can be used. Since the B' agent contains an inorganic particle (II) and a curing agent (III), it can be obtained, for example, by a method of mixing a liquid acid anhydride and an organosilica sol. The mixing for producing the B' agent is performed using a mixing apparatus and the desolvation is performed using an apparatus such as a rotary evaporator. The viscosity of the B' agent during the mixing is 50 mPas to 10,000 mPas as measured at 30° C. and this B' agent is stable even after 90 days.

The mixing of the A agent and the B agent (or the A' agent and the B' agent and the A agent and the B' agent) is performed using an apparatus such as a reaction flask.

The mixing is performed by a heating and mixing method and is performed, for example, at a temperature of 60° C. to 100° C. for 0.5 to 1 hour(s). The viscosity of the mixture of the A agent and the B agent (or the A' agent and the B' agent, the A agent and the B' agent) during the mixing is 1,000 mPas to 50,000 mPas as measured at 30° C. and the viscosity after 2 days is 2,000 mPas to 50,000 mPas measured at 30° C. The usable time of the A agent and the B agent (or the A' agent and the B' agent, the A agent and the B' agent) after the completion of the mixing is usually within 48 hours.

The liquid preparation for forming epoxy resin obtained by mixing the A agent and the B agent (or the A' agent and the B' agent, the A agent and the B' agent) has a viscosity appropriate for being used as a liquid sealing material. The liquid preparation for forming epoxy resin can be prepared so as to have an arbitral viscosity and for using as a transparent sealing material for LEDs or the like by a casting method, a potting method, a dispenser method, a printing method or the like. Therefore, the liquid preparation can partially seal the any portion of an LED or the like. By mounting the liquid preparation for forming epoxy resin directly as in a liquid state on the LED or the like by the above method and then drying and curing the preparation, an epoxy resin cured product can be obtained.

The drying is performed using a dryer at a temperature of 60 to 100° C. for 0.5 to 3 hours. Subsequently, the curing is performed. The curing is performed using an apparatus such as an oven at a temperature of 100 to 200° C. for 2 to 8 hours.

EXAMPLES

The following materials were prepared.

Synthesis of Modified Epoxy Resin (I-1)

894.7 g of α-type tris(2,3-epoxypropyl)-isocyanurate (manufactured by Nissan Chemical Industries, Ltd.; having an epoxy value of 9.95 eq/kg) and 400 g of toluene were charged into a reaction flask equipped with a condenser, a thermometer and a stirring apparatus and the content of the flask was warmed to a reflux temperature to completely dissolve the solid. Next, as a reaction catalyst, 313.3 g of a propionic anhydride solution in which 0.38 g of triphenylethylphosphonium bromide was dissolved was dropped into the reaction system over 60 minutes. After the completion of the dropping, the resultant reaction mixture was reacted at a reflux temperature for 2 hours. The reaction solution was concentrated to confirm that the epoxy value became 5.65 eq/kg or less (theoretical value: 5.48 eq/kg) and thereafter, toluene was distilled off to obtain 1,208 g of a liquid modified epoxy resin.

The composition of the obtained liquid modified epoxy resin (I-1) was as follows.

Assuming that tris(2,3-epoxypropyl)-isocyanurate is a compound (ii); a compound in which to one epoxy group of tris(2,3-epoxypropyl)-isocyanurate, one molecule of propionic anhydride is added (monoadduct) is a compound (i-1); a compound in which to two epoxy groups of tris(2,3-epoxypropyl)-isocyanurate, two molecules of propionic anhydride are added (diadduct) is a compound (i-2); and a compound in which to three epoxy groups of tris(2,3-epoxypropyl)-isocyanurate, three molecules of propionic anhydride are added (triadduct) is a compound (i-3), the molar ratio of (ii):(i-1):(i-2):(i-3) in the modified epoxy resin (I-1) was 35%:45%:17%:3%.

The viscosity of the modified epoxy resin (I-1) during the production was 1,300 mPas at 60° C., and after 90 days, 1,400 mPas at 60° C., so that the viscosity was stable.

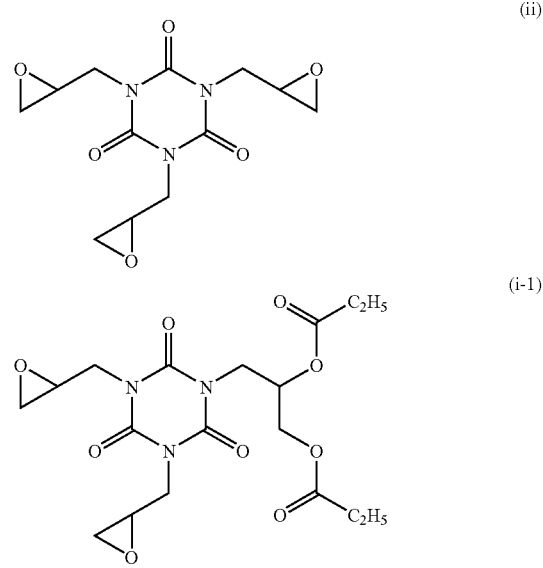

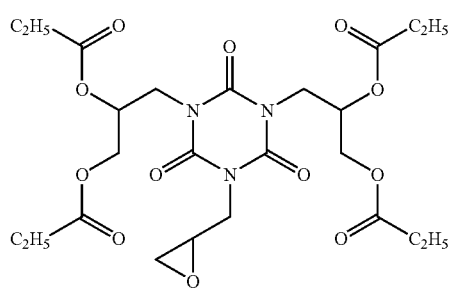

(i-2)

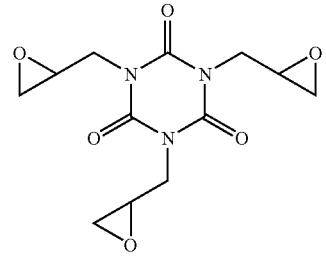

(ii)

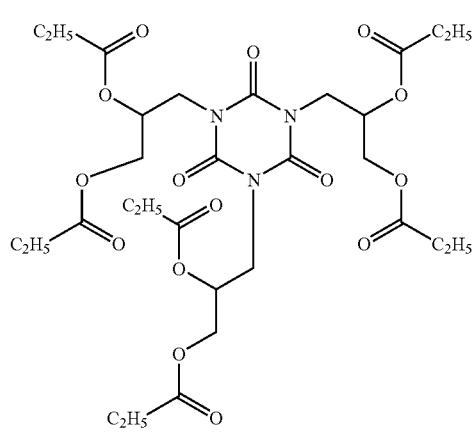

(i-3)

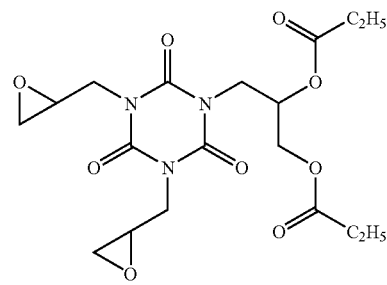

(i-1)

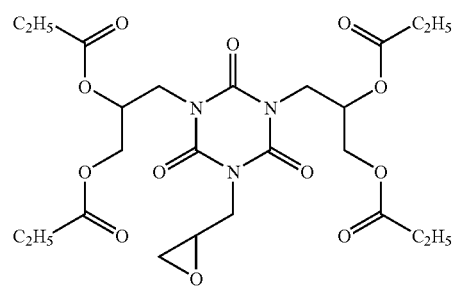

(i-2)

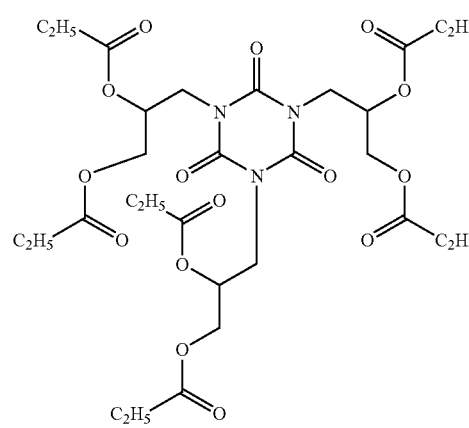

(i-3)

Synthesis of Modified Epoxy Resin (I-2)

894.7 g of α-type tris(2,3-epoxypropyl)-isocyanurate (manufactured by Nissan Chemical Industries, Ltd.; having an epoxy value of 9.95 eq/kg) and 400 g of toluene were charged into a reaction flask equipped with a condenser, a thermometer and a stirring apparatus, and the content of the flask was warmed to a reflux temperature to completely dissolve the solid. Next, as a reaction catalyst, 274.2 g of a propionic anhydride solution in which 0.38 g of triphenylethylphosphonium bromide was dissolved was dropped into the reaction system over 60 minutes. After the completion of the dropping, the resultant reaction mixture was reacted at a reflux temperature for 2 hours. The reaction solution was concentrated to confirm that the epoxy value became 6.1 eq/kg or less (theoretical value: 5.92 eq/kg) and thereafter, toluene was distilled off to obtain 1,169 g of a liquid modified epoxy resin.

The composition of the obtained liquid modified epoxy resin (I-2) was as follows.

Assuming that tris(2,3-epoxypropyl)-isocyanurate is a compound (ii); a compound in which to one epoxy group of tris(2,3-epoxypropyl)-isocyanurate, one molecule of propionic anhydride is added (monoadduct) is a compound (i-1); a compound in which to two epoxy groups of tris(2,3-epoxypropyl)-isocyanurate, two molecules of propionic anhydride are added (diadduct) is a compound (i-2); and a compound in which to three epoxy groups of tris(2,3-epoxypropyl)-isocyanurate, three molecules of propionic anhydride are added (triadduct) is a compound (i-3), the molar ratio of (ii):(i-1):(i-2):(i-3) in the modified epoxy resin (I-1) was 42%:43%:13%:2%.

The viscosity of the modified epoxy resin (I-2) during the production was 1,200 mPas at 60° C., and after 90 days, 1,300 mPas at 60° C., so that the viscosity was stable.

Synthesis of Modified Epoxy Resin (I-3)

594.6 g of α-type tris(2,3-epoxypropyl)-isocyanurate (manufactured by Nissan Chemical Industries, Ltd.; having an epoxy value of 9.95 eq/kg) and 80 g of acetonitrile were charged into a reaction flask equipped with a condenser, a thermometer and a stirring apparatus and the content of the flask was warmed to a reflux temperature to completely dissolve the solid. Next, as a reaction catalyst, 108 g of a propionic anhydride solution in which 0.28 g of triphenylethylphosphonium bromide was dissolved was dropped into the reaction system over 60 minutes. After the completion of the dropping, the resultant reaction mixture was reacted at a reflux temperature for 2 hours. The reaction solution was concentrated to confirm that the epoxy value became 7.5 eq/kg or less (theoretical value: 7.36 eq/kg) and thereafter, toluene was distilled off to obtain 702 g of a liquid modified epoxy resin.

The composition of the obtained liquid modified epoxy resin (I-2) was as follows.

Assuming that tris(2,3-epoxypropyl)-isocyanurate is a compound (ii); a compound in which to one epoxy group of tris(2,3-epoxypropyl)-isocyanurate, one molecule of propionic anhydride is added (monoadduct) is a compound (i-1); and a compound in which to two epoxy groups of tris(2,3-epoxypropyl)-isocyanurate, two molecules of propionic anhydride are added (diadduct) is a compound (i-2), the molar ratio of (ii):(i-1):(i-2) in the modified epoxy resin (I-2) was 60%:32%:8%.

The viscosity of the modified epoxy resin (I-2) during the production was 2,800 mPas at 60° C., and after 90 days, 3,000 mPas at 60° C., so that the viscosity was stable.

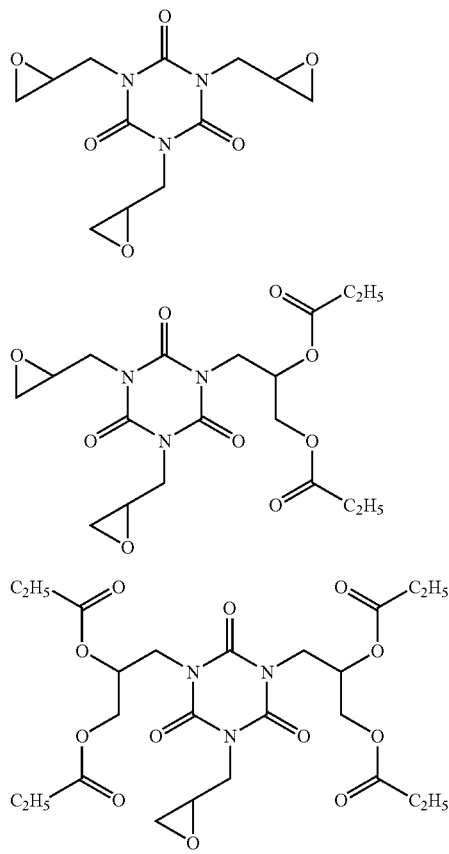

Liquid Epoxy Resin (I-4)

A commercially available liquid epoxy resin (trade name: CE-2021P; manufactured by Daicel Chemical Industries, Ltd.) was prepared.

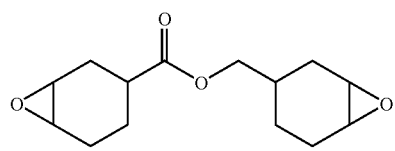

Liquid Epoxy Resin (I-5)

A commercially available liquid epoxy resin (trade name: Epikote 828; manufactured by Japan Epoxy Resins Co., Ltd.) was prepared.

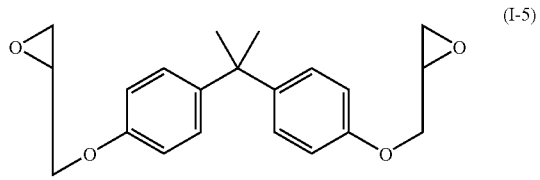

Liquid Epoxy Resin (I-6)

Tris(2,3-epoxypropyl)-isocyanurate (trade name: TEPIC S; manufactured by Nissan Chemical Industries, Ltd.) was prepared.

Silica Sol (II-1)

A neutral silica sol in which silica particles having an average particle diameter of 12 nm were dispersed in a solvent mixture of acetonitrile and methanol (acetonitrile: 49% by mass, $SiO_2$ concentration: 30% by mass, methanol: 20% by mass, water content: 0.8% by mass, pH of a sol diluted with water having the same mass as that of the sol: 6.4) was prepared according to the following procedure.

800 g of a methanol dispersed silica sol (trade name: MT-ST; manufactured by Nissan Chemical Industries, Ltd.; particle diameter measured by a nitrogen gas adsorption method: 12 nm, $SiO_2$ concentration: 30% by mass, methanol: 68% by mass, water content: 2% by mass, pH of a sol diluted with water having the same mass as that of the sol: 3.3) was charged into an egg plant-shaped flask having an inner volume of 2 L, and the solvent was evaporated and distilled off using a rotary evaporator at 70° C. of a bath temperature under 630 mbar while adding acetonitrile. The evaporation and distillation were performed while maintaining the liquid level substantially constant until the supply amount of acetonitrile became 600 g to obtain a solvent mixture of acetonitrile and methanol dispersed silica sol ($SiO_2$ concentration: 30% by mass, acetonitrile concentration: 49% by mass, methanol concentration: 19% by mass, water content: 0.9% by mass). Next, while stirring the obtained silica sol under atmospheric pressure, 16.0 g of phenyltrimethoxysilane was added to the silica sol and the resultant solution was heated at 65° C. of the reaction mixture temperature for 5 hours. By adding 17.0 g of a 1.0% by mass sodium hydroxide methanol solution to the sol with stirring to neutralize silica, the above silica sol (I-1) was obtained.

Silica Sol (II-2)

A neutral silica sol in which silica particles having an average particle diameter of 22 nm were dispersed in a solvent mixture of acetonitrile and methanol (acetonitrile: 49% by mass, $SiO_2$ concentration: 30% by mass, methanol: 20% by mass, water content: 0.8% by mass, pH of a sol diluted with water having the same mass as that of the silica sol: 6.4) was prepared.

This organosilica sol was obtained in substantially the same manner as in the preparation of (II-1) by subjecting 800 g of a methanol dispersed silica sol (particle diameter measured by a nitrogen adsorption method: 22 nm, $SiO_2$ concentration: 30% by mass, methanol: 68% by mass, water content: 2% by mass) as a raw material to a surface treatment with 10.9 g of phenyltrimethoxysilane and to neutralization with 12.4 g of a 1.0% by mass sodium hydroxide methanol solution.

Silica Sol (II-3)

A neutral silica sol in which silica particles having an average particle diameter of 23 nm were dispersed in a solvent mixture of acetonitrile and methanol (acetonitrile: 49% by mass, $SiO_2$ concentration: 30% by mass, methanol: 20% by mass, water content: 0.8% by mass, pH of a sol diluted with water having the same mass as that of the silica sol: 7.5) was prepared.

This organosilica sol was obtained in substantially the same manner as in the preparation of (II-1) by subjecting 600 g of a methanol dispersed silica sol (trade name: MA-ST-M; manufactured by Nissan Chemical Industries, Ltd.; particle diameter measured by a nitrogen adsorption method: 23 nm, $SiO_2$ concentration: 40% by mass, methanol: 58% by mass, water content: 2% by mass, pH of a sol diluted with water having the same mass as that of the silica sol: 3.5) as a raw material to a surface treatment with 10.4 g of phenyltrimethoxysilane and to neutralization with 7.7 g of a 1.0% by mass sodium hydroxide methanol solution.

Silica Sol (II-4)

A neutral silica sol in which silica particles having an average particle diameter of 25 nm were dispersed in a solvent mixture of acetonitrile and methanol (acetonitrile: 49% by mass, $SiO_2$ concentration: 30% by mass, methanol: 20% by mass, water content: 0.8% by mass, pH of a sol diluted with water having the same mass as that of the silica sol: 6.9) was prepared.

This organosilica sol was obtained in substantially the same manner as in the preparation of (II-1) by subjecting 800 g of a methanol dispersed silica sol (particle diameter measured by a nitrogen adsorption method: 25 nm, $SiO_2$ concentration: 30% by mass, methanol: 68% by mass, water content: 2% by mass) as a raw material to a surface treatment with 9.6 g of phenyltrimethoxysilane and to neutralization with 11.4 g of a 1.0% by mass sodium hydroxide methanol solution.

Silica Sol (II-5)

A neutral silica sol in which silica particles having an average particle diameter of 26 nm were dispersed in a solvent mixture of acetonitrile and methanol (acetonitrile: 49% by mass, $SiO_2$ concentration: 30% by mass, methanol: 20% by mass, water content: 0.8% by mass, pH of a sol diluted with water having the same mass as that of the silica sol: 6.4) was prepared.

This organosilica sol was obtained as a silica sol (II-5) in substantially the same manner as in the preparation of (II-1) by subjecting 800 g of a methanol dispersed silica sol (particle diameter measured by a nitrogen adsorption method: 26 nm, $SiO_2$ concentration: 30% by mass, methanol: 68% by mass, water content: 2% by mass) as a raw material to a surface treatment with 9.2 g of phenyltrimethoxysilane and to neutralization with 10.5 g of a 1.0% by mass sodium hydroxide methanol solution.

Silica Sol (II-6)

A neutral silica sol in which silica particles having an average particle diameter of 34 nm were dispersed in a solvent mixture of acetonitrile and methanol (acetonitrile: 49% by mass, $SiO_2$ concentration: 30% by mass, methanol: 20% by mass, water content: 0.8% by mass, pH of a sol diluted with water having the same mass as that of the silica sol: 5.9) was prepared.

This organosilica sol was obtained in substantially the same manner as in the preparation of (II-1) by subjecting 800 g of a methanol dispersed silica sol (particle diameter measured by a nitrogen adsorption method: 34 nm, $SiO_2$ concentration: 30% by mass, methanol: 68% by mass, water content: 2% by mass) as a raw material to a surface treatment with 7.1 g of phenyltrimethoxysilane and to neutralization with 12.7 g of a 1.0% by mass sodium hydroxide methanol solution.

Silica Sol (II-7)

A neutral silica sol in which silica particles having an average particle diameter of 25 nm were dispersed in a solvent mixture of acetonitrile and methanol (acetonitrile: 49% by mass, $SiO_2$ concentration: 30% by mass, methanol: 20% by mass, water content: 0.8% by mass, pH of a sol diluted with water having the same mass as that of the silica sol: 6.0) was prepared.

This organosilica sol was obtained in substantially the same manner as in the preparation of (II-1) by subjecting 800 g of a methanol dispersed silica sol (particle diameter measured by a nitrogen adsorption method: 25 nm, $SiO_2$ concentration: 30% by mass, methanol: 68% by mass, water content: 2% by mass) as a raw material to a surface treatment with 9.6 g of phenyltrimethoxysilane and to neutralization with 12.6 g of a 0.8% by mass calcium methoxide methanol solution.

Silica Sol (II-8)

A neutral silica sol in which silica particles having an average particle diameter of 25 nm were dispersed in a solvent mixture of acetonitrile and methanol (acetonitrile: 49% by mass, $SiO_2$ concentration: 30% by mass, methanol: 20% by mass, water content: 0.8% by mass, pH of a sol diluted with water having the same mass as that of the silica sol: 6.6) was prepared.

This organosilica sol was obtained in substantially the same manner as in the preparation of (II-1) by subjecting 800 g of a methanol dispersed silica sol (particle diameter measured by a nitrogen adsorption method: 25 nm, $SiO_2$ concentration: 30% by mass, methanol: 68% by mass, water content: 2% by mass) as a raw material to a surface treatment with 9.6 g of phenyltrimethoxysilane and to neutralization with 9.0 g of a 2.0% by mass tetramethylammonium hydroxide methanol solution.

Silica Sol (II-9)

A neutral silica sol in which silica particles having an average particle diameter of 12 nm were dispersed in acetonitrile (acetonitrile: 70% by mass, $SiO_2$ concentration: 30% by mass, methanol: 0.1% by mass, water content: 0.04% by mass, pH of a sol diluted with water having the same mass as that of the silica sol: 6.4) was prepared according to the following procedure.

This organosilica sol was obtained in substantially the same manner as in the preparation of (II-1) by subjecting 800 g of a methanol dispersed silica sol (trade name: MT-ST; manufactured by Nissan Chemical Industries, Ltd.; particle diameter measured by a nitrogen gas adsorption method: 12 nm, $SiO_2$ concentration: 30% by mass, methanol: 68% by mass, water content: 2% by mass; pH of a sol diluted with water having the same mass as that of the silica sol: 3.3) as a raw material to a surface treatment with 20.0 g of phenyltrimethoxysilane and to neutralization with 9.0 g of a 5.0% by mass 1,8-diazabicyclo(5,4,0)undecane-7-ene methanol solution to obtain 800 g of a neutral silica sol in which silica particles were dispersed in a solvent mixture of acetonitrile and methanol, and then by evaporating and distilling off the solvent using a rotary evaporator at 70° C. of a bath temperature under 450 mbar while maintaining the liquid level substantially constant and adding acetonitrile until the supply amount of acetonitrile became 1,200 g.

Silica Sol (II-10)

A neutral silica sol in which silica particles having an average particle diameter of 22 nm were dispersed in acetonitrile (acetonitrile: 70% by mass, $SiO_2$ concentration: 30% by mass, methanol: 0.1% by mass, water content: 0.05% by mass, pH of a sol diluted with water having the same mass as that of the silica sol: 7.1) was prepared.

This organosilica sol was obtained in substantially the same manner as in the preparation of (II-9) by subjecting 800 g of a methanol dispersed silica sol (particle diameter measured by a nitrogen adsorption method: 22 nm, $SiO_2$ concentration: 30% by mass, methanol: 68% by mass, water content: 2% by mass) as a raw material to a surface treatment with 10.9 g of phenyltrimethoxysilane and to neutralization with 10.6 g of a 5.0% by mass 1,8-diazabicyclo(5,4,0)undecane-7-ene methanol solution.

Silica Sol (II-11)

A neutral silica sol in which silica particles having an average particle diameter of 22 nm were dispersed in acetonitrile (acetonitrile: 70% by mass, $SiO_2$ concentration: 30% by mass, methanol: 0.1% by mass, water content: 0.05% by mass, pH of a sol diluted with water having the same mass as that of the silica sol: 6.4) was prepared.

This organosilica sol was obtained in substantially the same manner as in the preparation of (II-9) by subjecting 800 g of a methanol dispersed silica sol (particle diameter measured by a nitrogen adsorption method: 22 nm, $SiO_2$ concentration: 30% by mass, methanol: 68% by mass, water content: 2% by mass) as a raw material to a surface treatment with 10.9 g of phenyltrimethoxysilane and to neutralization with 15.2 g of a 1.0% by mass sodium hydroxide methanol solution.

Silica Sol (II-12)

A neutral silica sol in which silica particles having an average particle diameter of 26 nm were dispersed in a solvent mixture of acetonitrile and methanol (acetonitrile: 49% by mass, $SiO_2$ concentration: 30% by mass, methanol: 20% by mass, water content: 0.8% by mass, pH of a sol diluted with water having the same mass as that of the silica sol: 6.4) was prepared.

This organosilica sol was obtained in substantially the same manner as in the preparation of (II-1) by subjecting 800 g of a methanol dispersed silica sol (particle diameter measured by a nitrogen adsorption method: 26 nm, $SiO_2$ concentration: 30% by mass, methanol: 68% by mass, water content: 2% by mass) as a raw material to a surface treatment with 8.7 g of phenyldimethylmonoethoxysilane and to neutralization with 10.5 g of a 1.0% by mass sodium hydroxide methanol solution.

Silica Sol (II-13)

A neutral silica sol in which silica particles having an average particle diameter of 26 nm were dispersed in a solvent mixture of acetonitrile and methanol (acetonitrile: 49% by mass, $SiO_2$ concentration: 30% by mass, methanol: 20% by mass, water content: 0.8% by mass, pH of a sol diluted with water having the same mass as that of the silica sol: 6.4) was prepared.

This organosilica sol was obtained in substantially the same manner as in the preparation of (II-1) by subjecting 800 g of a methanol dispersed silica sol (particle diameter measured by a nitrogen adsorption method: 26 nm, $SiO_2$ concentration: 30% by mass, methanol: 68% by mass, water content: 2% by mass) as a raw material to a surface treatment with 9.1 g of cyclohexylmethyldimethoxysilane and to neutralization with 10.5 g of a 1.0% by mass sodium hydroxide methanol solution.

Silica Sol (II-14)

A neutral silica sol in which silica particles having an average particle diameter of 25 nm were dispersed in a solvent mixture of acetonitrile and methanol (acetonitrile: 49% by mass, $SiO_2$ concentration: 30% by mass, methanol: 20% by mass, water content: 0.8% by mass, pH of a sol diluted with water having the same mass as that of the silica sol: 3.3) was prepared.

This organosilica sol was obtained in substantially the same manner as in the preparation of (II-1), except that a silica sol was not subjected to neutralization with an alkali, by subjecting 800 g of a methanol dispersed silica sol (particle diameter measured by a nitrogen adsorption method: 25 nm, $SiO_2$ concentration: 30% by mass, methanol: 68% by mass, water content: 2% by mass) as a raw material to a surface treatment with 9.6 g of phenyltrimethoxysilane.

Curing Agent (III-1)

Methylhexahydrophthalic anhydride was prepared. The viscosity at 25° C. was 40 mPas to 60 mPas.

Curing Accelerator (IV-1)

Triphenylethylphosphonium bromide was prepared.

A liquid preparation for forming an epoxy resin containing an A agent and a B agent was produced in the following Examples. A modified epoxy resin (I) and an organosilica sol were mixed so that the silica solid concentration in the A agent becomes a desired concentration and thereafter, a solvent (such as acetonitrile and methanol) existing in the organosilica sol was removed by an evaporation method.

Example 1

A modified epoxy resin (I-1) and a silica sol (II-1) were mixed and stirred in a 500 mL separable egg plant-shaped flask to dissolve the solid and a solvent (acetonitrile and methanol) was removed using an evaporator to obtain an A agent. The A agent (36.76 g) contained 23.05 g of a modified epoxy resin (I-1), 12.13 g of silica particles having an average particle diameter of 12 nm and 1.58 g of a remaining solvent (acetonitrile). As the B agent, methylhexahydrophthalic anhydride was prepared. Into a four-neck flask, 36.76 g of the A agent and 17.20 g of the B agent were charged and the resultant mixture was mixed and stirred at 80° C. for 40 minutes. Subsequently, to the reaction mixture, a solution in which 250 mg of triphenylethylphosphonium bromide were dissolved in 5.0 g of methylhexahydrophthalic anhydride was added as a curing accelerator and further, the resultant reaction mixture was subjected to defoaming under reduced pressure for 2 minutes to obtain a liquid preparation for forming an epoxy resin. In the obtained liquid preparation for forming an epoxy resin, a remaining solvent was not detected.

The obtained liquid preparation for forming an epoxy resin was cast into a casting plate (made of a glass plate subjected to treatment with a mold release agent SR-2410 and having a thickness of 3 mm) and was subjected to heating treatment under curing conditions of at 100° C. for 2 hours and then, at 180° C. for 3 hours to obtain an epoxy resin cured product.

Examples 2 to 29

Substantially the same operations as in Example 1 were performed to obtain liquid preparations for forming an epoxy resin. In the following Tables, the composition of the A agent, the blending ratio of the A agent, the B agent and the curing accelerator and the mixing temperature and time are shown. The obtained liquid preparation for forming an epoxy resin was cast into a casting plate (made of a glass plate subjected to treatment with a mold release agent SR-2410 (manufactured by Dow Corning Toray, Co., Ltd.) and having a thickness of 3 mm) and was subjected to heating treatment under curing conditions of at 100° C. for 2 hours and then, at 180° C. for 3 hours to obtain an epoxy resin cured product.

In Tables, the type and the mass of the used modified epoxy resin (I) are described in the epoxy column of the A agent and the type of the used silica sol (II) and the mass of silica (solid content) are shown in the silica column of the A agent. In the solvent column, the mass of a remaining solvent contained in the A agent is shown, and in the blending amount column of the A agent, the total mass of the A agent including the epoxy and the silica, and further a remaining organic solvent if it exists, which are contained in the A agent is shown.

In the MeHHPA column of the B agent, the mass of methylhexahydrophthalic anhydride is shown, and in the curing accelerator column, TEP represents triphenylethylphosphonium bromide and TEP/MeHHPA shows the masses of methylhexahydrophthalic anhydride containing triphenylethylphosphonium bromide.

These blending amounts are shown in Table 1 to Table 3.

The A agent and the B agent were mixed and heated for a predetermined time to produce a liquid preparation for forming an epoxy resin and the liquid preparation was cast into a casting plate and was cured under a predetermined curing condition. The results are shown in Tables 4 to 6.

In the solvent column in Tables, "Not detected" indicates that a remaining solvent contained in the A agent was not detected in the liquid preparation for forming an epoxy resin. In the "Heating and mixing temperature and time" column, "80° C.-40 minutes" indicates that after the mixing, the heating was performed at 80° C. for 40 minutes and in the "Curing condition" column, "100° C.-2 h, then 180° C.-3 h" indicates that the heating was performed at 100° C. for 2 hours and then, at 180° C. for 3 hours.

TABLE 1

| | A agent | | | | B agent | Curing accelerator |
|---|---|---|---|---|---|---|
| | Blending amount | Epoxy | Silica | Solvent | MeHHPA | TEP/MeHHPA |
| Example 1 | 36.76 g | (I-1) 23.05 g | (II-1) 12.13 g | 1.58 g | 17.20 g | 250 mg/5.00 g |
| Example 2 | 42.24 g | (I-1) 17.74 g | (II-1) 21.12 g | 3.38 g | 13.35 g | 220 mg/5.00 g |
| Example 3 | 39.13 g | (I-1) 26.10 g | (II-5) 12.91 g | 0.12 g | 19.28 g | 260 mg/5.02 g |
| Example 4 | 41.60 g | (I-1) 20.01 g | (II-5) 20.80 g | 0.79 g | 13.92 g | 213 mg/5.00 g |
| Example 5 | 31.14 g | (I-1) 20.53 g | (II-6) 10.27 g | 0.34 g | 13.84 g | 208 mg/4.96 g |
| Example 6 | 41.77 g | (I-1) 19.29 g | (II-6) 20.89 g | 1.59 g | 13.65 g | 201 mg/5.00 g |
| Example 7 | 44.28 g | (I-1) 19.39 g | (II-3) 22.14 g | 2.75 g | 15.96 g | 218 mg/4.06 g |
| Example 8 | 44.40 g | (I-1) 19.45 g | (II-3) 22.20 g | 2.75 g | 16.00 g | 222 mg/2.00 g |
| Example 9 | 45.79 g | (I-1) 19.82 g | (II-1) 22.90 g | 3.07 g | 16.85 g | 228 mg/3.00 g |
| Example 10 | 42.08 g | (I-1) 18.89 g | (II-2) 21.04 g | 2.15 g | 16.30 g | 218 mg/2.00 g |

TABLE 2

| | A agent | | | | B agent | Curing accelerator |
|---|---|---|---|---|---|---|
| | Blending amount | Epoxy | Silica | Solvent | MeHHPA | TEP/MeHHPA |
| Example 11 | 41.95 g | (I-1) 19.17 g | (II-2) 20.98 g | 1.80 g | 15.80 g | 212 mg/2.00 g |
| Example 12 | 46.02 g | (I-1) 20.80 g | (II-2) 23.01 g | 2.21 g | 16.80 g | 234 mg/2.00 g |
| Example 13 | 45.32 g | (I-1) 20.76 g | (II-2) 22.66 g | 1.90 g | 17.70 g | 225 mg/2.00 g |
| Example 14 | 46.00 g | (I-1) 20.76 g | (II-2) 23.00 g | 2.21 g | 16.80 g | 232 mg/2.00 g |
| Example 15 | 45.65 g | (I-1) 20.22 g | (II-4) 22.83 g | 2.60 g | 15.69 g | 214 mg/4.06 g |
| Example 16 | 34.00 g | (I-1) 15.06 g | (II-4) 17.00 g | 1.94 g | 12.89 g | 175 mg/2.00 g |
| Example 17 | 45.30 g | (I-1) 20.07 g | (II-4) 22.65 g | 2.58 g | 15.80 g | 215 mg/2.00 g |
| Example 18 | 42.60 g | (I-1) 19.47 g | (II-2) 21.30 g | 1.83 g | 15.80 g | 211 mg/2.00 g |
| Example 19 | 42.08 g | (I-1) 18.89 g | (II-2) 21.04 g | 2.15 g | 16.60 g | 211 mg/2.00 g |

TABLE 3

| | A agent | | | | B agent | Curing accelerator |
|---|---|---|---|---|---|---|
| | Blending amount | Epoxy | Silica | Solvent | MeHHPA | TEP/MeHHPA |
| Example 20 | 50.36 g | (I-1) 21.76 g | (II-7) 25.18 g | 3.42 g | 16.95 g | 252 mg/5.00 g |
| Example 21 | 46.20 g | (I-1) 21.58 g | (II-8) 23.10 g | 1.52 g | 15.60 g | 236 mg/5.00 g |
| Example 22 | 46.00 g | (I-1) 20.79 g | (II-9) 23.00 g | 2.21 g | 16.80 g | 232 mg/2.00 g |
| Example 23 | 47.84 g | (I-1) 23.92 g | (II-11) 23.92 g | 3.25 g | 18.62 g | 242 mg/2.00 g |
| Example 24 | 26.02 g | (I-1) 11.24 g | (II-11) 13.01 g | 1.77 g | 8.08 g | 129 mg/2.00 g |
| Example 25 | 54.68 g | (I-1) 19.14 g | (II-10) 22.84 g | 3.70 g | 17.84 g | 232 mg/2.06 g |
| Example 26 | 46.07 g | (I-1) 20.04 g | (II-10) 23.04 g | 2.99 g | 17.72 g | 229 mg/2.00 g |
| Example 27 | 44.45 g | (I-1) 22.22 g | (II-12) 22.23 g | 0.00 g | 14.45 g | 224 mg/4.45 g |
| Example 28 | 46.80 g | (I-1) 21.86 g | (II-13) 23.40 g | 1.54 g | 14.80 g | 238 mg/4.80 g |
| Example 29 | 45.70 g | (I-2) 19.15 g | (II-2) 22.85 g | 3.70 g | 17.98 g | 233 mg/2.00 g |

TABLE 4

| | Presence of solvent | Heating and mixing temperature and time | Curing condition |
|---|---|---|---|
| Example 1 | Not detected | 80° C.-40 minutes | 100° C.-2 h, then 180° C.-3 h |
| Example 2 | Not detected | 80° C.-40 minutes | 100° C.-2 h, then 180° C.-3 h |
| Example 3 | Not detected | 80° C.-40 minutes | 100° C.-2 h, then 180° C.-3 h |
| Example 4 | Not detected | 80° C.-40 minutes | 100° C.-2 h, then 180° C.-3 h |
| Example 5 | Not detected | 80° C.-40 minutes | 100° C.-2 h, then 180° C.-3 h |
| Example 6 | Not detected | 80° C.-40 minutes | 100° C.-2 h, then 180° C.-3 h |
| Example 7 | Not detected | 80° C.-10 minutes | 100° C.-2 h, then 180° C.-3 h |
| Example 8 | Not detected | 80° C.-40 minutes | 100° C.-2 h, then 180° C.-3 h |
| Example 9 | Not detected | 80° C.-10 minutes | 100° C.-2 h, then 180° C.-3 h |
| Example 10 | Not detected | 80° C.-10 minutes | 100° C.-2 h, then 180° C.-3 h |

TABLE 5

| | Presence of solvent | Heating and mixing temperature and time | Curing condition |
|---|---|---|---|
| Example 11 | Not detected | 80° C.-10 minutes | 100° C.-2 h, then 180° C.-3 h |
| Example 12 | Not detected | 90° C.-30 minutes | 100° C.-2 h, then 180° C.-3 h |
| Example 13 | Not detected | 80° C.-10 minutes | 100° C.-2 h, then 180° C.-3 h |
| Example 14 | Not detected | 80° C.-10 minutes | 100° C.-2 h, then 180° C.-3 h |
| Example 15 | Not detected | 80° C.-10 minutes | 100° C.-2 h, then 180° C.-3 h |
| Example 16 | Not detected | 90° C.-40 minutes | 100° C.-2 h, then 180° C.-3 h |
| Example 17 | Not detected | 80° C.-10 minutes | 100° C.-2 h, then 180° C.-3 h |
| Example 18 | Not detected | 80° C.-40 minutes | 100° C.-2 h, then 180° C.-3 h |
| Example 19 | Not detected | 80° C.-30 minutes | 100° C.-2 h, then 180° C.-3 h |

TABLE 6

| | Presence of solvent | Heating and mixing temperature and time | Curing condition |
|---|---|---|---|
| Example 20 | Not detected | 80° C.-10 minutes | 100° C.-2 h, then 180° C.-3 h |
| Example 21 | Not detected | 80° C.-10 minutes | 100° C.-2 h, then 180° C.-3 h |
| Example 22 | Not detected | 80° C.-20 minutes | 100° C.-2 h, then 180° C.-3 h |
| Example 23 | Not detected | 80° C.-30 minutes | 100° C.-2 h, then 180° C.-3 h |
| Example 24 | Not detected | 80° C.-30 minutes | 100° C.-2 h, then 180° C.-3 h |
| Example 25 | Not detected | 80° C.-30 minutes | 100° C.-2 h, then 180° C.-3 h |
| Example 26 | Not detected | 80° C.-30 minutes | 100° C.-2 h, then 180° C.-3 h |
| Example 27 | Not detected | 80° C.-10 minutes | 100° C.-2 h, then 180° C.-3 h |
| Example 28 | Not detected | 80° C.-10 minutes | 100° C.-2 h, then 180° C.-3 h |
| Example 29 | Not detected | 80° C.-30 minutes | 100° C.-2 h, then 180° C.-3 h |

With respect to the epoxy resin cured products obtained in Examples, the three-point bending test (bending strength and flexural modulus), the transmittance, the linear expansion coefficient and the boiling water absorption were measured.

(Measurement of Bending Property)

The bending property was measured according to JIS K-6911 using a tension tester.

The height and the width of the test piece were measured. The test piece was supported and a load was applied to the center of the test piece by a pressurizing wedge. The load when the test piece was broken was measured and therefrom, the bending strength ($\sigma$) was calculated according to the equation:

$$\sigma = (3PL)/(2Wh^2)$$

where, $\sigma$: bending strength (MPa) (kgf/mm$^2$), P: load when the test piece was broken (N) (kgf), L: distance between the supports (mm), W: width of the test piece (mm), h: height of the test piece (mm).

The flexural modulus (E) (MPa) (kgf/mm$^2$) was calculated according to the equation:

$$E = (L^3/(4Wh^3)) \times (F/Y)$$

where, F/Y: inclination of a linear portion of a load-flexure curve (N/mm) (kgf/mm).

(Measurement of Transmittance)

The transmittance at 200 to 800 nm was measured using a spectrophotometer.

(Measurement of Linear Expansion Coefficient)

The linear expansion coefficient was measured according to JIS K-6911. The thickness of the test piece was precisely measured and the linear expansion coefficient α1 was measured by a TMA (thermal mechanical analysis) under such conditions that the load is 0.05 N and the temperature elevating rate is 1° C./min and was calculated according to the equation:

α-1 = amount of length change (ΔL1) from length at 30° C. to length at 80° C. of test piece/initial length (L) of test piece×50.

(Measurement of Boiling Water Absorption)

The boiling water absorption was measured according to JIS K-6911. In a thermostatic chamber maintained at 50° C., the test piece was subjected to drying treatment for 24 hours. After the completion of the treatment, the test piece was cooled down to 20° C. in a desiccator and the mass thereof was measured. The test piece was immersed in boiled distilled water and boiled for 100 hours and then taken out of boiled water. The test piece was cooled in running water of 20° C. for 30 minutes and water content was wiped off from the test piece. Immediately thereafter, the mass of the test piece after the water absorption was measured.

The boiling water absorption was calculated according to the equation:

$$A = ((W_2 - W_1)/W_1) \times 100$$

where, A: boiling water absorption (%), $W_1$: mass (g) of test piece before boiling, and $W_2$: mass (g) of test piece after boiling.

The physical property values of the epoxy resin cured products obtained in

Examples are shown in Tables 7 to 9.

In Tables, the bending strength value and the flexural modulus value are shown in a unit of MPa and the transmittance value is shown as the light ray transmittance (%) measured at wavelengths of 400 nm and 450 nm. The linear expansion coefficient is shown in a unit of ppm/° C. and the boiling water absorption is shown in a unit of %.

TABLE 7

|  | Three-point bending test (MPa) | | Transmittance (%) | | Linear expansion coefficient (ppm/° C.) | Boiling water absorption after 100 hr (%) |
|---|---|---|---|---|---|---|
|  | Bending strength | Flexural modulus | 400 nm | 450 nm | | |
| Example 1 | 76.6 | 4120 | 81.2 | 87.0 | 71.0 | 3.6 |
| Example 2 | 93.0 | 4390 | 79.1 | 85.3 | 70.0 | 5.0 |
| Example 3 | 88.3 | 3580 | 63.4 | 79.5 | 67.0 | 2.5 |
| Example 4 | 115.5 | 4595 | 62.3 | 78.4 | 60.0 | 3.2 |
| Example 5 | 97.7 | 4050 | 38.5 | 62.3 | 82.0 | 6.1 |
| Example 6 | 66.5 | 4530 | 47.6 | 68.6 | 62.0 | 2.6 |
| Example 7 | 112.6 | 4650 | 72.2 | 81.1 | 68.0 | 4.6 |
| Example 8 | 105.7 | 4710 | 74.4 | 83.2 | 58.0 | 5.4 |
| Example 9 | 115.0 | 4490 | 76.6 | 86.2 | 68.0 | 3.9 |
| Example 10 | 110.6 | 4470 | 71.0 | 83.1 | 60.0 | 3.5 |

TABLE 8

|  | Three-point bending test (MPa) | | Transmittance (%) | | Linear expansion coefficient (ppm/° C.) | Boiling water absorption after 100 hr (%) |
|---|---|---|---|---|---|---|
|  | Bending strength | Flexural modulus | 400 nm | 450 nm | | |
| Example 11 | 112.5 | 4430 | 63.6 | 79.2 | 61.0 | 3.3 |
| Example 12 | 80.1 | 4560 | 56.8 | 76.4 | 64.0 | 3.4 |
| Example 13 | 92.3 | 4260 | 64.0 | 79.3 | 66.5 | 2.9 |
| Example 14 | 89.6 | 4260 | 65.8 | 79.6 | 76.0 | 2.4 |
| Example 15 | 71.3 | 4440 | 67.1 | 81.7 | 75.0 | 2.9 |
| Example 16 | 129.0 | 4655 | 56.0 | 75.0 | 65.0 | 3.5 |
| Example 17 | 88.5 | 4430 | 65.1 | 79.3 | 80.0 | 1.8 |
| Example 18 | 59.7 | 4660 | 48.3 | 69.3 | 62.0 | 3.7 |
| Example 19 | 80.5 | 4590 | 57.3 | 75.0 | 60.0 | 3.3 |

TABLE 9

|  | Three-point bending test (MPa) | | Transmittance (%) | | Linear expansion coefficient (ppm/° C.) | Boiling water absorption after 100 hr (%) |
|---|---|---|---|---|---|---|
|  | Bending strength | Flexural modulus | 400 nm | 450 nm | | |
| Example 20 | 80.9 | 4620 | 45.4 | 68.9 | 77.0 | 3.3 |
| Example 21 | 90.7 | 4300 | 43.2 | 67.6 | 60.0 | 3.3 |
| Example 22 | 100.6 | 4480 | 69.1 | 82.1 | 64.0 | 4.1 |
| Example 23 | 98.7 | 4580 | 75.6 | 84.7 | 58.0 | 4.2 |
| Example 24 | 112.9 | 4580 | 70.1 | 81.9 | 62.0 | 2.6 |
| Example 25 | 149.3 | 4470 | 62.4 | 77.8 | 60.5 | 3.6 |
| Example 26 | 134.4 | 4540 | 40.0 | 65.5 | 62.0 | 3.7 |
| Example 27 | 109.0 | 4590 | 49.6 | 70.9 | 66.5 | 4.9 |
| Example 28 | 99.5 | 4380 | 54.4 | 74.2 | 60.0 | 3.2 |
| Example 29 | 144.2 | 4500 | 71.3 | 83.5 | 56.0 | 2.6 |

Example 30

As the A' agent, a modified epoxy resin (I-1) was prepared. 400 g of a silica sol (II-5) was charged into an egg plant-shaped flask having an inner volume of 1 L and by evaporating and distilling off a solvent using a rotary evaporator at 70° C. of a bath temperature under 450 mbar while maintaining the liquid level substantially constant and adding acetonitrile until the supply amount of acetonitrile became 600 g, an acetonitrile dispersed silica sol ($SiO_2$ concentration: 30% by mass, acetonitrile concentration: 70% by mass, methanol concentration: 0.1% by mass, water content: 0.04% by mass), was obtained. The obtained silica sol was mixed and stirred with methylhexahydrophthalic anhydride to dissolve the solid, and the solvent (acetonitrile) was removed by an evaporator to obtain a B' agent. The B' agent (32.93 g) contained 16.46 g of methylhexahydrophthalic anhydride and 16.47 g of silica particles having an average diameter of 26 nm and did not contain the solvent (acetonitrile). Into a four-neck flask, 20.37 g of the A' agent and 32.93 g of the B' agent were charged and the resultant mixture was mixed and stirred at 80° C. for 10 minutes. Subsequently, to the reaction mixture, a solution in which 210 mg of triphenylethylphosphonium bromide were dissolved in 1.70 g of methylhexahydrophthalic anhydride was added as a curing accelerator and further, the resultant reaction mixture was subjected to defoaming under reduced pressure for 2 minutes to obtain a liquid preparation for forming an epoxy resin.

The obtained liquid preparation for forming an epoxy resin was cast into a casting plate (made of a glass plate subjected to treatment with a mold release agent SR-2410 and having a thickness of 3 mm) and was subjected to heating treatment under curing conditions of at 100° C. for 2 hours and then, at 180° C. for 3 hours to obtain an epoxy resin cured product.

Examples 31 to 35

Examples were performed in substantially the same manner as in Example 30.

The obtained liquid preparation for forming an epoxy resin was cast into a casting plate (made of a glass plate subjected to treatment with a mold release agent SR-2410 and having a thickness of 3 mm) and was subjected to heating treatment under curing conditions of at 100° C. for 2 hours and then, at 180° C. for 3 hours to obtain an epoxy resin cured product.

In Tables, the type and the mass of the used modified epoxy resin (I) are described in the epoxy column of the A' agent. In the MeHHPA column of the B' agent, the mass of methylhexahydrophthalic anhydride is shown, and in the silica column of the B' agent, the type of the used silica sol (II) and the mass of silica (solid content) are shown. In the blending amount column of the B' agent, the total mass of the B' agent including methylhexahydrophthalic anhydride and the silica, and further a remaining organic solvent if it exists, which are contained in the B' agent, are shown. In the curing accelerator column, TEP represents triphenylethylphosphonium bromide and TEP/MeHP shows the masses of methylhexahydrophthalic anhydride containing triphenylethylphosphonium bromide.

TABLE 10

| | A' agent Epoxy | B' agent Blending amount | MeHHPA | Silica | Solvent | Curing accelerator TEP/MeHHPA |
|---|---|---|---|---|---|---|
| Example 30 | (I-1) 20.37 g | 32.93 g | 16.46 g | (II-5) 16.47 g | 0.00 g | 210 mg/1.70 g |
| Example 31 | (I-1) 25.16 g | 36.50 g | 18.25 g | (II-4) 18.25 g | 0.00 g | 248 mg/2.00 g |
| Example 32 | (I-1) 21.72 g | 39.67 g | 19.83 g | (II-4) 19.84 g | 0.00 g | 210 mg/5.02 g |
| Example 33 | (I-1) 25.80 g | 40.00 g | 20.00 g | (II-2) 20.00 g | 0.00 g | 254 mg/3.00 g |
| Example 34 | (I-3) 17.50 g | 39.40 g | 19.70 g | (II-4) 19.70 g | 0.00 g | 182 mg/2.00 g |
| Example 35 | (I-1) 21.25 g | 35.77 g | 17.88 g | (II-14) 17.89 g | 0.00 g | 210 mg/2.15 g |

The A' agent and the B' agent were mixed and heated for a predetermined time to produce a liquid preparation for forming an epoxy resin and the liquid preparation was cast into a casting plate and was cured under a predetermined curing condition. The results are shown in the following Table.

In the solvent column in Table, "Not detected" indicates that a remaining solvent was not detected in the liquid preparation for forming an epoxy resin and in the "Heating and mixing temperature and time" column, "80° C.-10 minutes" indicates that after the mixing, the heating was performed at 80° C. for 10 minutes. In the "Curing condition" column, "100° C.-2 h, then 180° C.-3 h" indicates that the heating was performed at 100° C. for 2 hours and then, at 180° C. for 3 hours.

TABLE 11

| | Presence of solvent | Heating and mixing temperature and time | Curing condition |
|---|---|---|---|
| Example 30 | Not detected | 80° C.-10 minutes | 100° C.-2 h, then 180° C.-3 h |
| Example 31 | Not detected | 80° C.-10 minutes | 100° C.-2 h, then 180° C.-3 h |
| Example 32 | Not detected | 80° C.-10 minutes | 100° C.-2 h, then 180° C.-3 h |
| Example 33 | Not detected | 80° C.-10 minutes | 100° C.-2 h, then 180° C.-3 h |
| Example 34 | Not detected | 80° C.-10 minutes | 100° C.-2 h, then 180° C.-3 h |
| Example 35 | Not detected | 80° C.-10 minutes | 100° C.-2 h, then 180° C.-3 h |

In the following Tables, the composition of the B' agent, the blending ratio of the A' agent, the B' agent and the curing accelerator and the mixing temperature and time are shown.

With respect to the epoxy resin cured products obtained in the above Examples, the three-point bending test (bending strength and flexural modulus), the transmittance, the linear expansion coefficient and the boiling water absorption were measured by the above method.

In Table, the bending strength value and the flexural modulus value are shown in a unit of MPa and the transmittance value is shown as the light ray transmittance (%) measured at wavelengths of 400 nm and 450 nm. The linear expansion coefficient is shown in a unit of ppm/° C. and the boiling water absorption is shown in a unit of %.

TABLE 12

| | Three-point bending test (MPa) | | Transmittance (%) | | Linear expansion coefficient | Boiling water absorption |
|---|---|---|---|---|---|---|
| | Bending strength | Flexural modulus | 400 nm | 450 nm | ppm/° C. | after 100 hr (%) |
| Example 30 | 115.8 | 4190 | 70.4 | 80.8 | 58.5 | 2.4 |
| Example 31 | 134.0 | 4330 | 66.5 | 78.6 | 66.0 | 3.0 |
| Example 32 | 128.6 | 4460 | 64.7 | 78.0 | 64.0 | 4.0 |
| Example 33 | 75.2 | 4110 | 73.0 | 83.8 | 64.0 | 3.5 |
| Example 34 | 68.1 | 4550 | 69.6 | 82.8 | 53.0 | 2.7 |
| Example 35 | 120.2 | 4380 | 49.9 | 74.7 | 58.0 | 4.0 |

Comparative Example 1

Into a four-neck flask, 35.35 g of a modified epoxy resin (I-1) and 26.5 g of methylhexahydrophthalic anhydride were charged and the resultant mixture was mixed and stirred at 80° C. for 10 minutes. Subsequently, to the resultant reaction mixture, a solution in which 340 mg of triphenylethylphosphonium bromide was dissolved in 5.2 g of methylhexahydrophthalic anhydride was added as a curing accelerator and further, the resultant reaction mixture was subjected to defoaming for 2 minutes to obtain a liquid preparation for forming an epoxy resin.

The obtained liquid preparation for forming an epoxy resin was cast into a casting plate (made of a glass plate subjected to treatment with a mold release agent SR-2410 (manufactured by Dow Corning Toray, Co., Ltd.) and having a thickness of 3 mm) and was subjected to heating treatment under curing conditions of at 100° C. for 2 hours and then, at 180° C. for 3 hours to obtain an epoxy resin cured product.

Comparative Examples 2 to 7

Comparative Examples were performed in substantially the same manner as in Comparative Example 1, except that the conditions such as the type of the used modified epoxy resin were varied.

In Table, the type and the mass of the used modified epoxy resin are shown in the epoxy column of the A' agent and in the MeHHPA column of the B' agent, the mass of methylhexahydrophthalic anhydride is shown. In the silica column of the B' agent, the type of the used silica sol and the mass of silica (solid content) are shown. In the blending amount column of the B' agent, the total mass of the B' agent including methylhexahydrophthalic anhydride and the silica, and further a remaining organic solvent if it exists, which are contained in the B' agent, is shown. In the curing accelerator column, TEP represents triphenylethylphosphonium bromide and TEP/MeHP shows the masses methylhexahydrophthalic anhydride containing triphenylethylphosphonium bromide.

TABLE 13

| | A' agent Epoxy | B' agent | | | | Curing accelerator TEP/MeHHPA |
|---|---|---|---|---|---|---|
| | | Blending amount | MeHHPA | Silica | Solvent | |
| Comparative Example 1 | (I-1) 35.35 g | 26.50 g | 26.50 g | 0.00 g | 0.00 g | 340 mg/5.20 g |
| Comparative Example 2 | (I-3) 23.08 g | 24.60 g | 24.60 g | 0.00 g | 0.00 g | 228 mg/4.00 g |
| Comparative Example 3 | (I-6) 16.50 g | 40.21 g | 26.94 g | (II-1) 13.27 g | 0.00 g | 170 mg/3.20 g |
| Comparative Example 4 | (I-6) 13.20 g | 40.03 g | 20.01 g | (II-5) 20.02 g | 0.00 g | 145 mg/2.10 g |
| Comparative Example 5 | (I-6) 13.07 g | 41.41 g | 20.70 g | (II-6) 20.71 g | 0.00 g | 130 mg/2.10 g |
| Comparative Example 6 | (I-4) 18.63 g | 44.21 g | 22.10 g | (II-4) 22.11 g | 0.00 g | 186 mg/2.00 g |
| Comparative Example 7 | (I-5) 20.10 g | 33.25 g | 16.62 g | (II-4) 16.63 g | 0.00 g | 206 mg/1.60 g |

The A' agent and the B' agent were mixed and heated for a predetermined time to produce a liquid preparation for forming an epoxy resin and the liquid preparation was cast into a casting plate and was cured under a predetermined curing condition. The results are shown in the following Table.

In the solvent column in Table, "Not detected" indicates that a remaining solvent was not detected in the liquid preparation for forming an epoxy resin and in the "Heating and mixing temperature and time" column, "80° C.-10 minutes" indicates that after the mixing, the heating was performed at 80° C. for 10 minutes. In the "Curing condition" column, "100° C.-2 h, then 180° C.-3 h" indicates that the heating was performed at 100° C. for 2 hours and then, at 180° C. for 3 hours.

TABLE 14

|  | Presence of solvent | Heating and mixing temperature and time | Curing condition |
|---|---|---|---|
| Comparative Example 1 | Not detected | 80° C.-10 minutes | 100° C.-2 h, then 180° C.-3 h |
| Comparative Example 2 | Not detected | 80° C.-10 minutes | 100° C.-2 h, then 180° C.-3 h |
| Comparative Example 3 | Not detected | 80° C.-10 minutes | 100° C.-2 h, then 180° C.-3 h |
| Comparative Example 4 | Not detected | 80° C.-10 minutes | 100° C.-2 h, then 180° C.-3 h |
| Comparative Example 5 | Not detected | 80° C.-10 minutes | 100° C.-2 h, then 180° C.-3 h |
| Comparative Example 6 | Not detected | 80° C.-10 minutes | 100° C.-2 h, then 180° C.-3 h |
| Comparative Example 7 | Not detected | 80° C.-10 minutes | 100° C.-2 h, then 180° C.-3 h |

With respect to the epoxy resin cured products obtained in the above Comparative Examples, the three-point bending test (bending strength and flexural modulus), the transmittance, the linear expansion coefficient and the boiling water absorption were measured by the above method.

In Table, the bending strength value and the flexural modulus value are shown in a unit of MPa and the transmittance value is shown as the light ray transmittance (%) measured at wavelengths of 400 nm and 450 nm. The linear expansion coefficient is shown in a unit of ppm/° C. and the boiling water absorption is shown in a unit of %.

TABLE 15

|  | Three-point bending test (MPa) | | Transmittance (%) | | Linear expansion coefficient | Boiling water absorption |
|---|---|---|---|---|---|---|
|  | Bending strength | Flexural modulus | 400 nm | 450 nm | (ppm/° C.) | After 100 hr (%) |
| Comparative Example 1 | 48.8 | 2885 | 78.6 | 90.1 | 83.0 | 2.3 |
| Comparative Example 2 | 40.2 | 2885 | 78.3 | 91.1 | 66.0 | 2.5 |
| Comparative Example 3 | 77.0 | 4120 | 79.0 | 87.7 | 52.5 | 5.1 |
| Comparative Example 4 | 67.0 | 4890 | 65.9 | 80.2 | 45.0 | 4.0 |
| Comparative Example 5 | 53.5 | 4975 | 33.5 | 65.4 | 46.5 | 3.4 |
| Comparative Example 6 | 95.5 | 4460 | 67.8 | 79.7 | 52.5 | 3.1 |
| Comparative Example 7 | 164.9 | 4060 | 45.3 | 62.7 | 48.0 | 1.7 |

When the curing property values of Examples are compared with those of Comparative Examples 1 and 2, in Examples, by blending inorganic particles such as silica particles, a high bending strength value was obtained. In addition, the linear expansion coefficient can be lowered, so that when the cured products are used in a sealing material for an LED (light emitting device) or the like, a peeling due to the difference in the thermal expansion can be prevented. Although the light ray transmittance is lowered to some extent, by selecting silica particles having a small particle diameter of the colloidal silica, high light ray transmittance can be maintained.

In addition, in applications requiring no transparency (for example, sealing materials for semiconductor), silica particles having a large particle diameter can also be used.

When the curing property values of Examples are compared with those of Comparative Examples 3 to 5, while in Comparative Examples 3 to 5, prepared were liquid preparations for forming an epoxy resin in which a solid epoxy resin was dissolved in a liquid acid anhydride containing silica, the liquid preparation for forming an epoxy resin of the present invention prepared using the same silica particles is more excellent in bending strength and transparency than the liquid preparations of Comparative Examples 3 to 5.

When Comparative Examples 6 and 7 using a liquid epoxy resin different from that of the present invention are compared with Examples of the present invention, while the liquid preparations for forming an epoxy resin of Comparative Examples 6 and 7 do not satisfy the requirements for both the bending strength and high transparency, the liquid preparations for forming an epoxy resin of Examples of the present invention satisfy the requirements for all performances such as high bending strength, high transparency and water-absorption resistance. Thus, it is considered that the liquid preparation for forming an epoxy resin of the present invention prepared by combining a modified epoxy resin and inorganic particles (particularly, colloidal silica) is excellent.

INDUSTRIAL APPLICABILITY

The related-art solid sealing material is used for a mold method using a mold, however, is not suitable for the high-mix low-volume production of the recent years.

The present invention is a liquid preparation for forming an epoxy resin which is useful as a liquid sealing material. The liquid preparation for forming an epoxy resin can be prepared at any viscosity and can partially seal any portion by a casting method, a potting method, a dispenser method, a printing method or the like. Thus, the liquid preparation for forming an epoxy resin is useful in a site of the high-mix low-volume production or the like.

Then, the liquid preparation for forming an epoxy resin of the present invention has balance between high strength and high transparency.

The invention claimed is:

1. A liquid preparation for forming an epoxy resin comprising:
an A agent; and
a B agent; wherein
the A agent contains a modified epoxy resin (I) formed from at least one type of compound (i) having in a molecule thereof, at least one functional group represented by Formula (1):

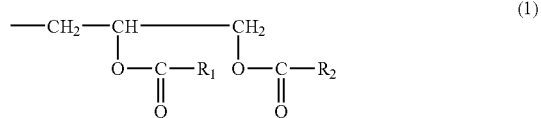

(where R1 and R2 individually represent an alkyl group, an alkenyl group, an alkynyl group, an aryl group, an aralkyl group, a heterocyclic group or a halogenated, aminated or nitrated derivative of any of the groups) and a compound (ii) having a glycidyl group in a molecule thereof, and an inorganic particle (II), the inorganic particle being a colloidal silica sol having an average particle diameter of 5 to 100 nm; and
the B agent contains a curing agent (III).

2. The liquid preparation for forming an epoxy resin according to claim 1, wherein the B agent is also in a liquid state.

3. The liquid preparation for forming an epoxy resin according to claim 1, wherein the compound (i) is a compound in which 1 to 16 glycidyl groups are replaced by a functional group represented by Formula (1).

4. The liquid preparation for forming an epoxy resin according to claim 1, wherein the compound (ii) is a compound having 2 to 16 glycidyl groups.

5. The liquid preparation for forming an epoxy resin according to claim 1, wherein the molar ratio of the compound (i):the compound (ii) is 1:0.3 to 1.5.

6. The liquid preparation for forming an epoxy resin according to claim 1, wherein the compound (i) is a compound in which a glycidyl group of tris(2,3-epoxypropyl)-isocyanurate is replaced by the functional group represented by Formula (1).

7. The liquid preparation for forming an epoxy resin according to claim 1, wherein the compound (ii) is tris(2,3-epoxypropyl)-isocyanurate.

8. The liquid preparation for forming an epoxy resin according to claim 1, wherein the particle surface of the colloidal silica is coated with an organosilane through a reaction with an organoalkoxysilane.

9. The liquid preparation for forming an epoxy resin according to claim 1, wherein the curing agent is an acid anhydride.

10. A liquid preparation for forming an epoxy resin comprising:
an A' agent; and
a B' agent; wherein
the A' agent contains a modified epoxy resin (I) formed from at least one type of compound (i) having in a molecule thereof, at least one functional group represented by Formula (1):

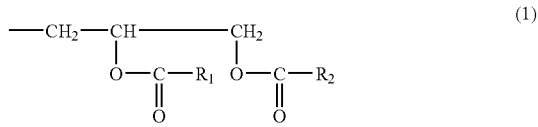

(where R1 and R2 individually represent an alkyl group, an alkenyl group, an alkynyl group, an aryl group, an aralkyl group, a heterocyclic group or a halogenated, aminated or nitrated derivative of any of the groups) and a compound (ii) having a glycidyl group in a molecule thereof; and
the B' agent contains an inorganic particle (II) and a curing agent (III), the inorganic particle being a colloidal silica sol having an average particle diameter of 5 to 100 nm.

11. The liquid preparation for forming an epoxy resin according to claim 10, wherein the B' agent is also in a liquid state.

12. The liquid preparation for forming an epoxy resin according to claim 10, wherein the particle surface of the colloidal silica is coated with an organosilane through a reaction with an organoalkoxysilane.

13. A liquid preparation for forming an epoxy resin comprising:
an A agent; and
a B' agent; wherein
the A agent contains a modified epoxy resin (I) formed from at least one type of compound (i) having in a molecule thereof, at least one functional group represented by Formula (1):

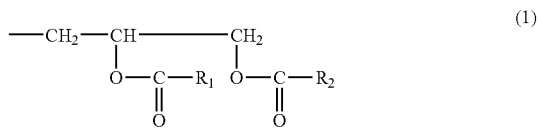

(where R1 and R2 individually represent an alkyl group, an alkenyl group, an alkynyl group, an aryl group, an aralkyl group, a heterocyclic group or a halogenated, aminated or nitrated derivative of any of the groups) and a compound (ii) having a glycidyl group in a molecule thereof, and an inorganic particle (II), the inorganic particle being a colloidal silica sol having an average particle diameter of 5 to 100 nm; and
the B' agent contains the inorganic particle (II) and a curing agent (III).

14. The liquid preparation for forming an epoxy resin according to claim 13, wherein the B' agent is also in a liquid state.

15. The liquid preparation for forming an epoxy resin according to claim 13, wherein the particle surface of the colloidal silica is coated with an organosilane through a reaction with an organoalkoxysilane.

* * * * *